United States Patent
Umematsu et al.

(10) Patent No.: US 10,154,609 B2
(45) Date of Patent: Dec. 11, 2018

(54) CABLE UNIT AND SERVER APPARATUS

(71) Applicant: FUJITSU LIMITED, Kawasaki-shi, Kanagawa (JP)

(72) Inventors: Misao Umematsu, Kawasaki (JP); Masanori Tachibana, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/719,831

(22) Filed: Sep. 29, 2017

(65) Prior Publication Data
US 2018/0124944 A1 May 3, 2018

(30) Foreign Application Priority Data
Oct. 31, 2016 (JP) .................................. 2016-213821

(51) Int. Cl.
*H02B 1/20* (2006.01)
*H05K 7/14* (2006.01)

(52) U.S. Cl.
CPC ......... *H05K 7/1491* (2013.01); *H05K 7/1489* (2013.01)

(58) Field of Classification Search
CPC ............................ H05K 7/1491; H05K 7/1489
USPC ........................................................ 361/826
See application file for complete search history.

(56) References Cited

U.S. PATENT DOCUMENTS

| | | | | |
|---|---|---|---|---|
| 3,336,434 A | * | 8/1967 | Crimmins | H01R 12/61 174/72 R |
| 4,832,613 A | * | 5/1989 | Tsukakoshi | H01R 13/631 439/141 |
| D474,449 S | * | 5/2003 | Rosander | D13/147 |
| 6,736,648 B2 | * | 5/2004 | Terunuma | H01R 9/226 439/76.2 |
| 7,070,445 B2 | * | 7/2006 | Shah | H01R 4/2454 439/397 |
| 9,705,258 B2 | * | 7/2017 | Phillips | H01R 13/6581 |
| 2013/0050963 A1 | * | 2/2013 | Zhou | H02G 11/006 361/752 |
| 2017/0261130 A1 | * | 9/2017 | Bernert | F16L 3/2053 |

FOREIGN PATENT DOCUMENTS

| | | |
|---|---|---|
| JP | 2-116766 U | 9/1990 |
| JP | 07-221469 A | 8/1995 |
| JP | 08-181463 A | 7/1996 |

* cited by examiner

*Primary Examiner* — Hung S Bui
(74) *Attorney, Agent, or Firm* — Fujitsu Patent Center

(57) ABSTRACT

A cable unit includes a first casing body, a second connector body, a first connector, a second casing, and a cable. The first casing body forms an open shape that includes a first main wall and a first peripheral side-wall. The second casing body forms an open shape that includes a second main wall and a second peripheral side-wall. The second casing body is fitted together with the first casing body such that the second casing body and the first casing body configure a box-shaped casing that expands and contracts along a direction in which the first main wall and the second main wall face each other. The first connector is provided to the first main wall. The second connector is provided to the second main wall. The cable is housed in the casing and connects the first connector with the second connector.

11 Claims, 18 Drawing Sheets

CABLE UNIT AND SERVER APPARATUS

CROSS-REFERENCE TO RELATED APPLICATION

This application is based upon and claims the benefit of priority of the prior Japanese Patent Application No. 2016-213821, filed on Oct. 31, 2016, the entire contents of which are incorporated herein by reference.

FIELD

Technology disclosed herein relates to a cable unit that connects electronic units and a server apparatus provided therewith.

BACKGROUND

Data centers that include server apparatuses have come into use in recent years. In the server apparatuses employed in such data centers, electronic units mounted at the front-face side of a rack are connected to electronic units mounted at the back-face side of the rack by a cable.

RELATED PATENT DOCUMENTS

Patent Document 1: Japanese Patent Application Laid-Open (JP-A) No. H08-181463
Patent Document 2: Japanese Utility Model Application Laid-Open (JP-U) No. H02-116766
Patent Document 3: JP-A H07-221469

SUMMARY

According to an aspect of the embodiments, an apparatus includes a first casing body, a second connector body, a first connector, a second casing, and a cable. The first casing body forms an open shape that includes a first main wall and a first peripheral side-wall formed at a peripheral edge of the first main wall. The second casing body forms an open shape that includes a second main wall and a second peripheral side-wall formed at peripheral edge of the second main wall, and the second casing body is fitted together with the first casing body at respective open portion sides of the second casing body and the first casing body such that the second casing body and the first casing body configure a box-shaped casing that expands and contracts along a direction in which the first main wall and the second main wall face each other. The first connector is provided to the first main wall. The second connector is provided to the second main wall. The cable is housed in the casing and connects the first connector with the second connector.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Explanation follows regarding an exemplary embodiment of technology disclosed herein.

Server Apparatus

Figure 1:
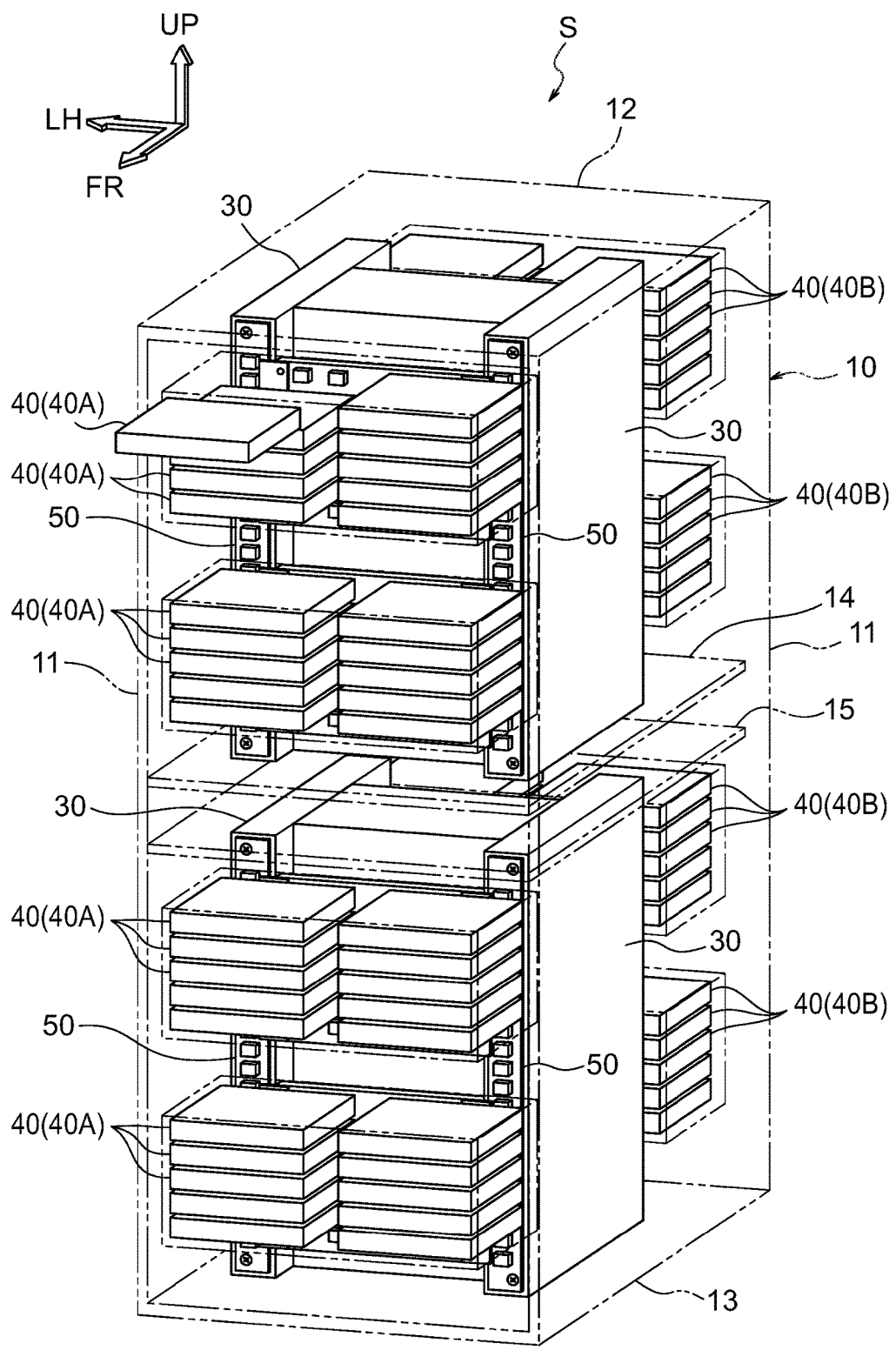
FIG. 1 is a perspective view of a server apparatus according to an exemplary embodiment, as viewed from a front-face side.
Figure 2:
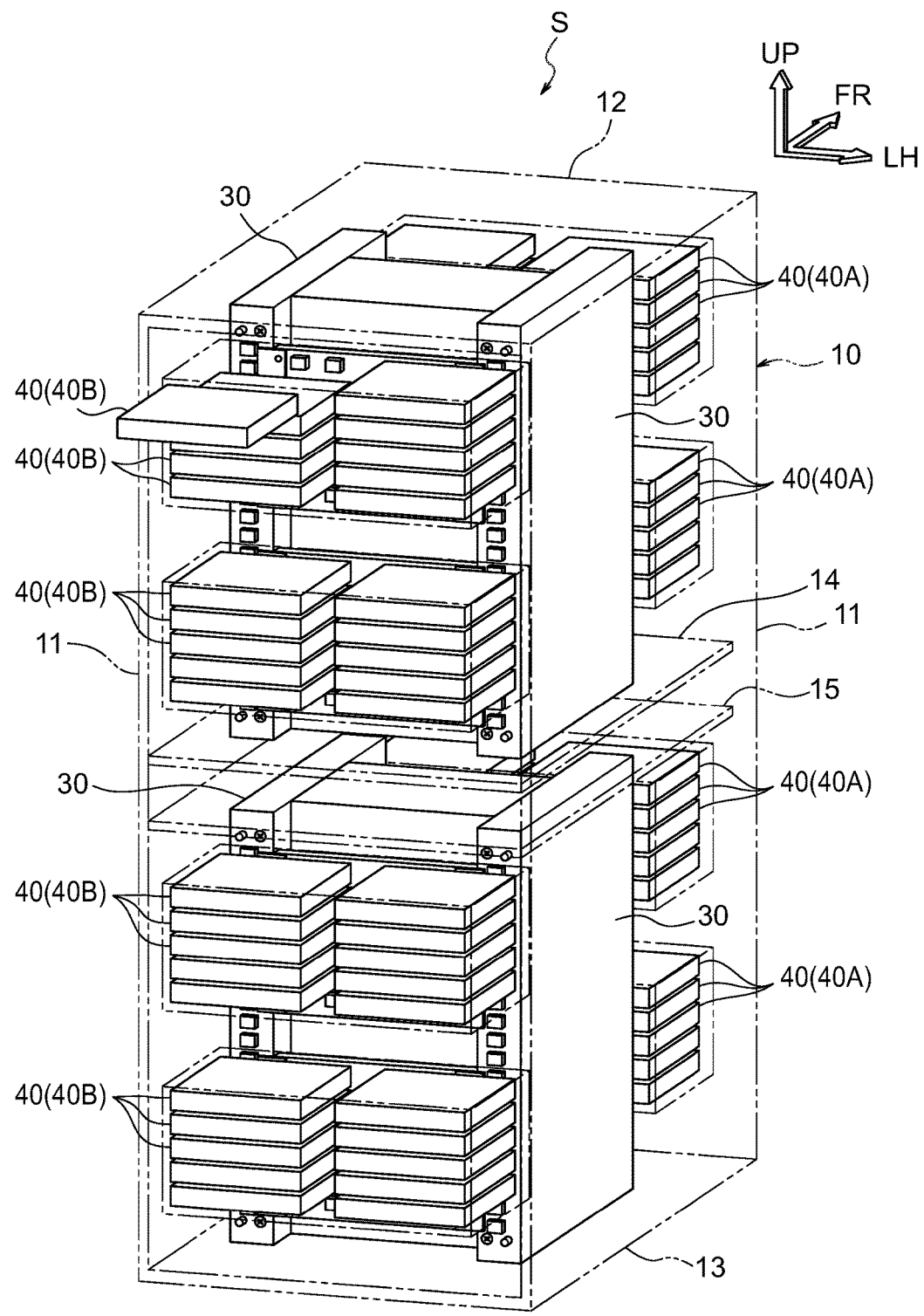
FIG. 2 is a perspective view of the server apparatus of FIG. 1, as viewed from a back-face side.

As illustrated in FIG. 1 and FIG. 2, a server apparatus S according to the present exemplary embodiment includes a rack 10, plural electronic units 40, and cable units 50. In each of the drawings, the arrow FR, the arrow LH, and the arrow UP respectively indicate the front-rear direction front side, the left-right direction left side, and the up-down direction upper side of the server apparatus S. In the following explanation, members with names affixed with "first" indicate members disposed at the front-face side of the rack 10, and members with names affixed with "second" indicate members disposed at the back-face side of the rack 10.

Rack

The rack 10 is formed in a cuboidal shape having its length direction in the up-down direction of the server apparatus S. The rack 10 includes a pair of side-walls 11, an upper wall 12 that is coupled to the upper ends of the pair of side-walls 11, a lower wall 13 that is coupled to lower ends of the pair of side-walls 11, and a pair of interior walls 14, 15 that are coupled to up-down direction central portions of the pair of side-walls 11. The pair of interior walls 14, 15 are disposed so as to face the up-down direction of the rack 10. The front-face side and the back-face side of the rack 10 are open, as illustrated in FIG. 1 and FIG. 2.

As illustrated in FIG. 1 and FIG. 2, plural housing sections 30 (shelvings) are provided to the rack 10. In the present exemplary embodiment there are, for example, four housing sections 30. Each housing section 30 is formed in a flattened box shape, and is disposed with its length direction in the up-down direction of the rack 10 and with its thickness direction in the left-right direction of the rack 10. The four housing sections 30 are respectively disposed between either the upper wall 12 and the interior wall 14 or between the lower wall 13 and the interior wall 15.

Upper ends of the upper side pair of the housing sections 30 disposed between the upper wall 12 and the interior wall 14 are connected to the upper wall 12, and lower ends of the upper side pair of housing sections 30 are connected to the interior wall 14. One of the upper side pair of housing sections 30 is disposed at one side of the side-walls 11, and the other of the upper side pair of housing sections 30 is disposed at the other side of the side-walls 11.

The front-rear direction length of the upper side pair of housing sections 30 is shorter than the front-rear direction length of the rack 10, and the upper side pair of housing sections 30 are disposed at a front-rear direction central side of the rack 10. Thus, as illustrated in FIG. 1, a space for mounting front-face-side electronic units 40 (40A), described later, is secured between the upper side pair of housing sections 30 and the front face of the rack 10. As illustrated in FIG. 2, a space for mounting back-face-side electronic units 40 (40B), described later, is also secured between the upper side pair of housing sections 30 and the back face of the rack 10.

Similarly, upper ends of the lower side pair of the housing sections 30 disposed between the lower wall 13 and the interior wall 15 are connected to the interior wall 15, and lower ends of the lower side pair of housing sections 30 are connected to the lower wall 13. One of the lower side pair of housing sections 30 is disposed at one side of the side-walls 11, and the other of the lower side pair of housing sections 30 is disposed at the other side of the side-walls 11.

The front-rear direction length of the lower side pair of housing sections 30 is shorter than the front-rear direction length of the rack 10, and the lower side pair of housing sections 30 are disposed at a front-rear direction central side of the rack 10. Thus, as illustrated in FIG. 1, a space for mounting front-face-side electronic units 40 (40A), described later, is secured between the lower side pair of housing sections 30 and the front face of the rack 10. As illustrated in FIG. 2, a space for mounting back-face-side electronic units 40 (40B), described later, is also secured between the lower side pair of housing sections 30 and the back face of the rack 10.

Figure 3:
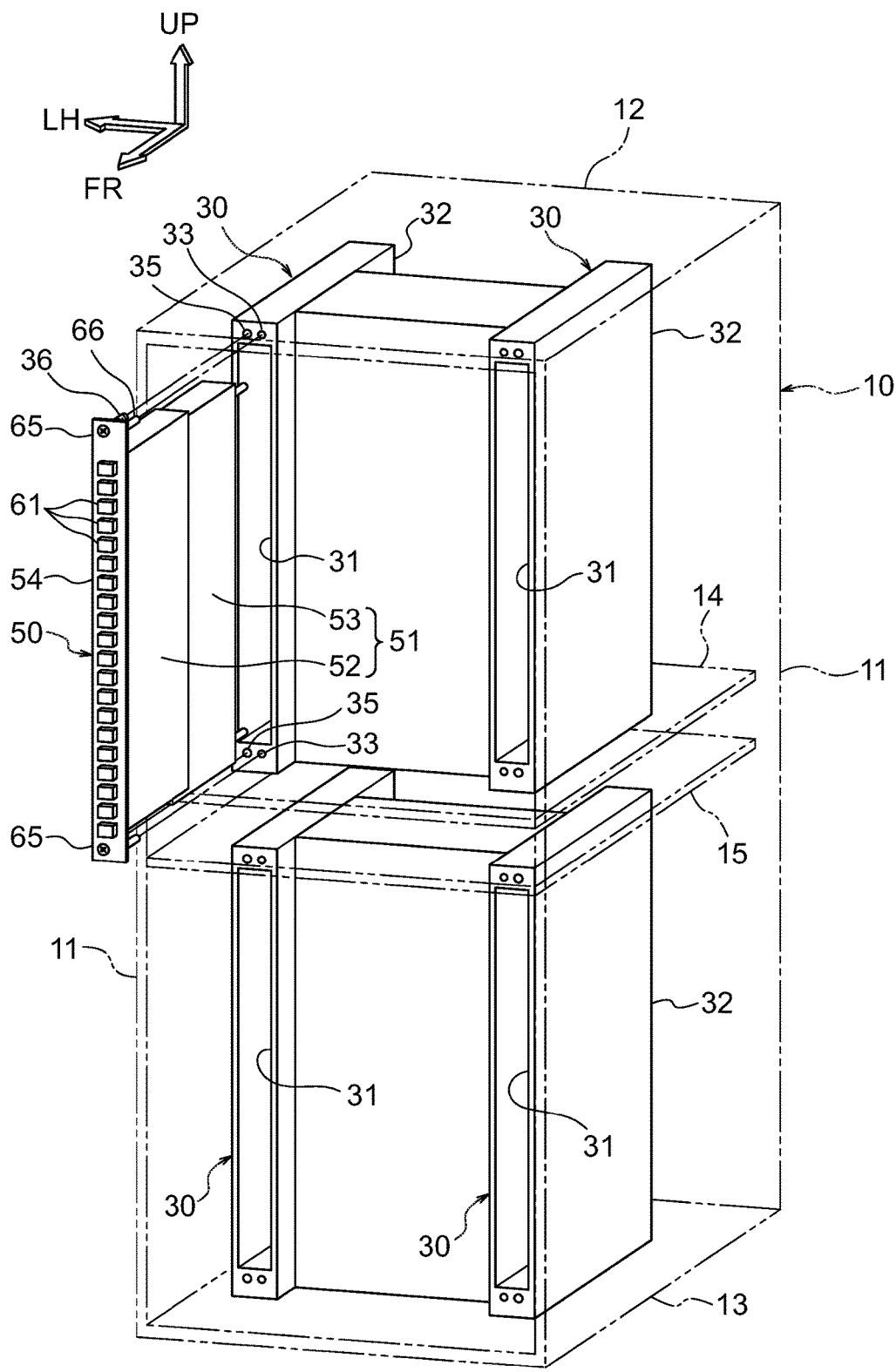
FIG. 3 is a perspective view illustrating mounting of a cable unit in the rack of FIG. 1.

As illustrated in FIG. 3, each of the housing sections 30 has an opening 31 at the front-face side of the rack 10. Each of the housing sections 30 also has an end wall 32 at the back-face side of the rack 10. Each of the housing sections 30 is thus formed in a recessed box shape having an opening 31 and an end wall 32.

Electronic Units

The plural electronic units 40 include the electronic units 40 disposed at the front-face side of the rack 10 illustrated in FIG. 1 and the electronic units 40 disposed at the back-face side of the rack 10 illustrated in FIG. 2. In the following, when distinction is made between the electronic units 40 mounted at the front-face side of the rack 10 and the electronic units 40 mounted at the back-face side of the rack 10, the former are referred to as first electronic units 40A and the latter are referred to as second electronic units 40B. The first electronic units 40A and the second electronic units 40B can be implemented by identical components.

As illustrated in FIG. 1, each of the first electronic units 40A disposed at the front-face side of the rack 10 is formed with a flat board shape. Each first electronic unit 40A is disposed with its thickness direction in the up-down direction of the rack 10. The plural first electronic units 40A include plural upper-level first electronic units 40A disposed between the upper wall 12 and the interior wall 14 and plural lower-level first electronic units 40A disposed between the lower wall 13 and the interior wall 15.

Both of the plural upper-level first electronic units 40A and the plural lower-level first electronic units 40A are disposed further toward the front-face side of the rack 10 than the housing sections 30. Both of the plural upper-level first electronic units 40A and the plural lower-level first electronic units 40A are also divided into two columns in the left-right direction of the rack 10. In each column, plural of the first electronic units 40A are disposed so as be stacked in the up-down direction of the rack 10.

Similarly, as illustrated in FIG. 2, each of the second electronic units 40B disposed at the back-face side of the rack 10 is formed with a flat board shape. Each second electronic unit 40B is disposed with its thickness direction in the up-down direction of the rack 10. The plural second electronic units 40B include plural upper-level second electronic units 40B disposed between the upper wall 12 and the interior wall 14 and plural lower-level second electronic units 40B disposed between the lower wall 13 and the interior wall 15.

Both of the plural upper-level second electronic units 40B and the plural lower-level second electronic units 40B are disposed further toward the back-face side of the rack 10 than the housing sections 30. Both of the plural upper-level second electronic units 40B and the plural lower-level second electronic units 40B are also divided into two columns in the left-right direction of the rack 10. In each column, plural of the second electronic units 40B are disposed so as to be stacked in the up-down direction of the rack 10.

Cable Units

Figure 4:
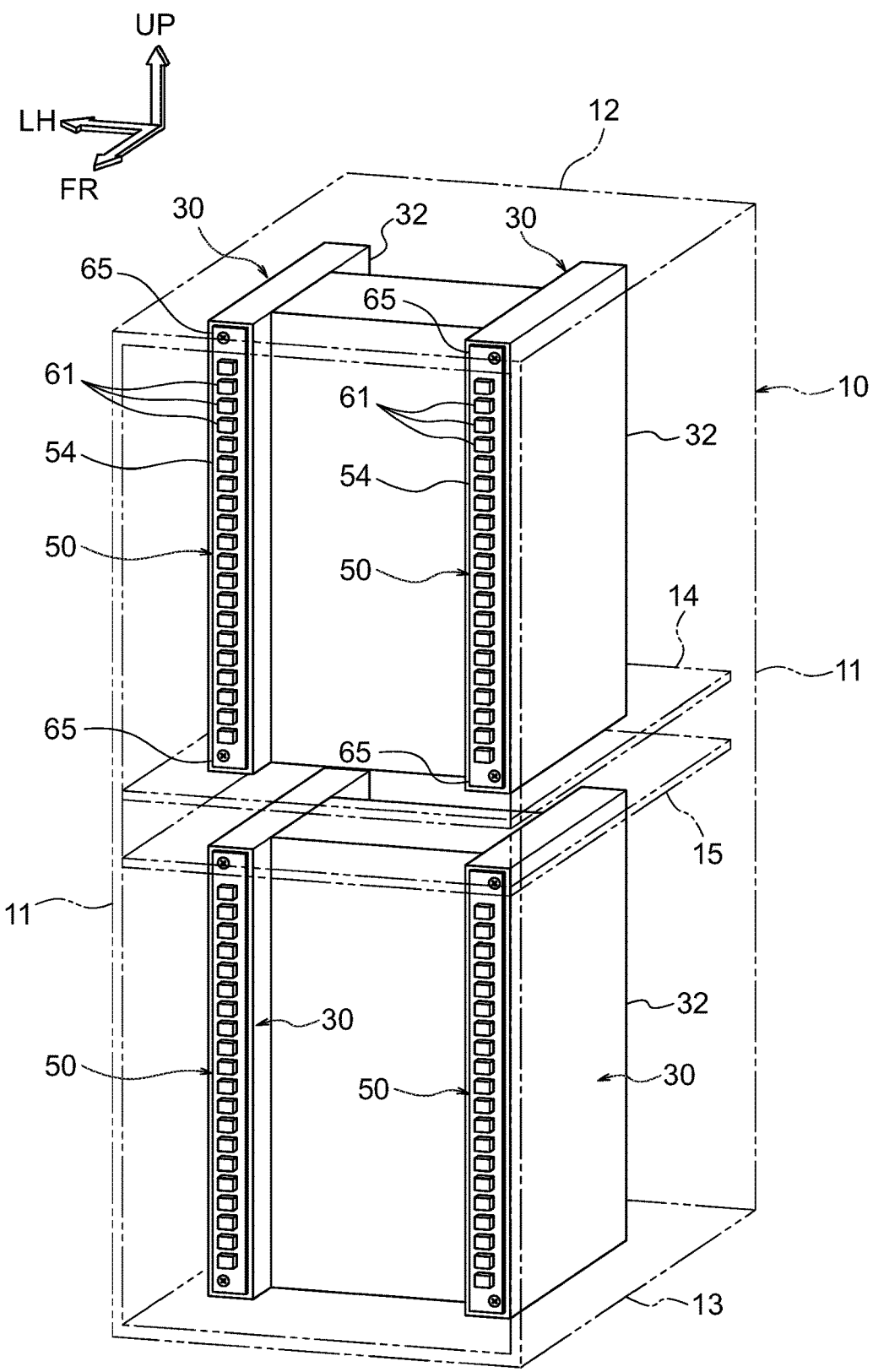
FIG. 4 is a perspective view illustrating a state in which a cable unit has been mounted in the rack of FIG. 1.
Figure 5:
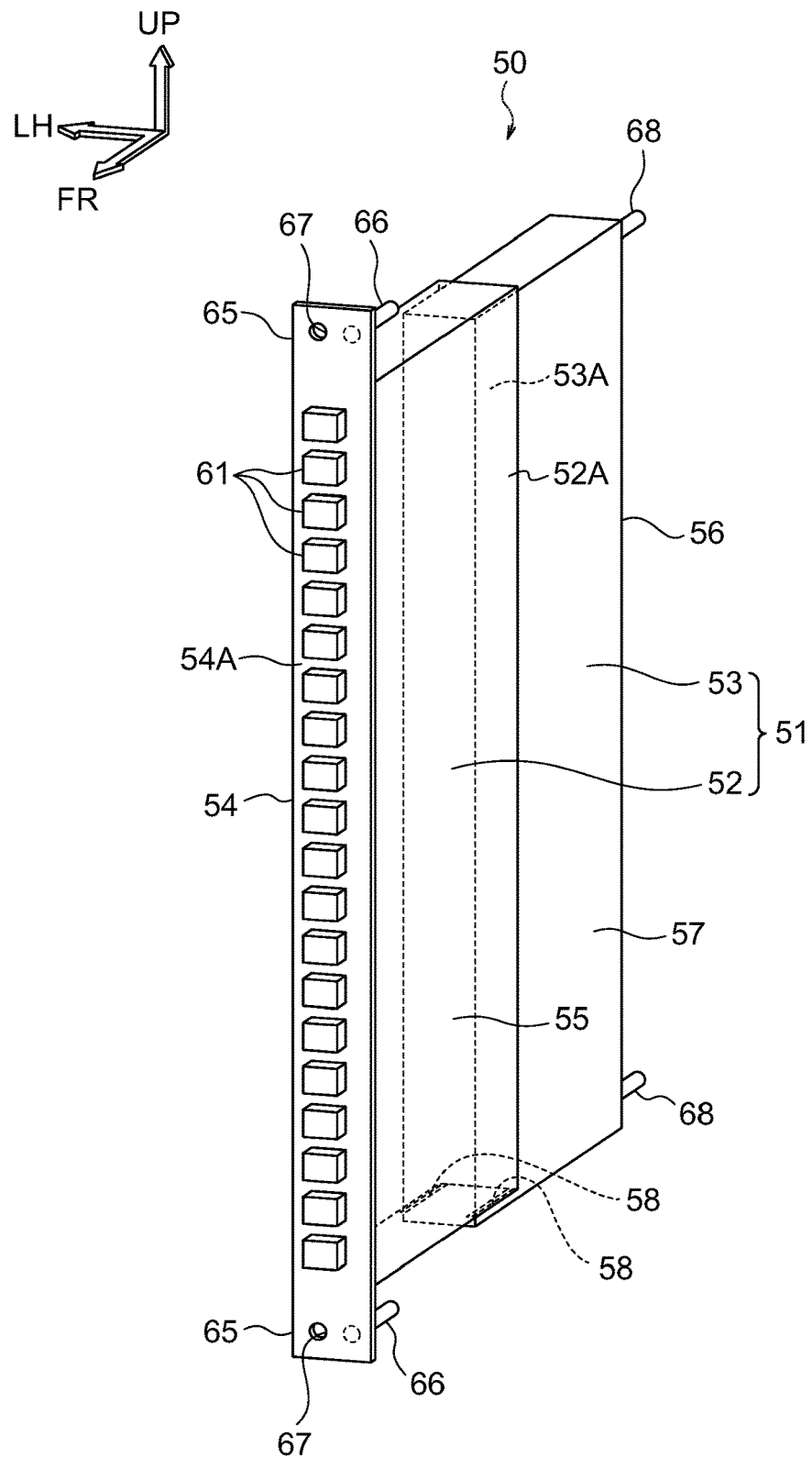
FIG. 5 is a perspective view of the cable unit of FIG. 3, as viewed from the front-face side.
Figure 6:
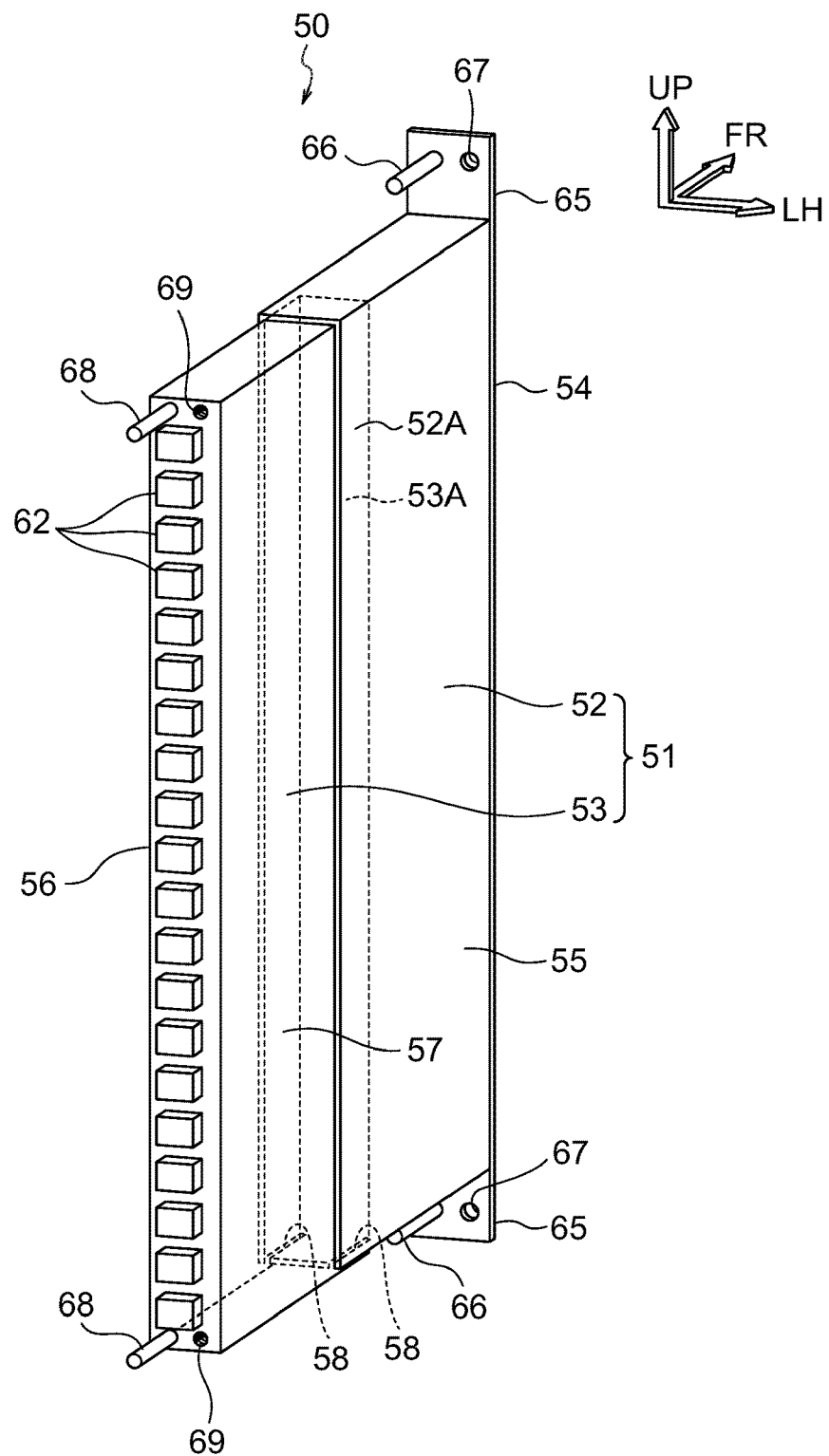
FIG. 6 is a perspective view of the cable unit of FIG. 3, as viewed from the back-face side.

As illustrated in FIG. 3 and FIG. 4, plural of the cable units 50 are housed in each of the housing sections 30. As an example, the plural cable units 50 all have the same configuration. As illustrated in FIG. 5 and FIG. 6, each cable unit 50 includes a casing 51. The casing 51 includes a first casing body 52 and a second casing body 53 separated in the front-rear direction of the cable units 50. The first casing body 52 configures a front-face-side half of the casing 51, and the second casing body 53 configures a back-face-side half of the casing 51.

As illustrated in FIG. 5, the first casing body 52 includes a first main wall 54 and first peripheral side-walls 55 formed at the peripheral edges of the first main wall 54. The first main wall 54 is formed such that its length direction in the up-down direction of the cable unit 50 and such that its thickness direction in the front-rear direction of the cable unit 50. The first peripheral side-walls 55 extend from the peripheral edges of the first main wall 54 toward the back-face side of the cable unit 50. The first main wall 54 forms a front face of the cable unit 50, and the first peripheral side-walls 55 form a front-face-side upper face, a front-face-side lower face, and a pair of front-face-side side-faces of the cable unit 50. Due to having the first main wall 54 and the first peripheral side-walls 55, the first casing body 52 forms an open shape that is open toward the back-face side of the cable unit 50.

As illustrated in FIG. 6, the second casing body 53 includes a second main wall 56 and second peripheral side-walls 57 formed at the peripheral edges of the second main wall 56. The second main wall 56 is formed such that its length direction in the up-down direction of the cable unit 50 and such that its thickness direction in the front-rear direction of the cable unit 50. The second peripheral side-walls 57 extend from the peripheral edges of the second main wall 56 toward the front-face side of the cable unit 50. The second main wall 56 forms a back face of the cable unit 50, and the second peripheral side-walls 57 form a back-face-side upper face, a back-face-side lower face, and a pair of back-face-side side-faces of the cable unit 50. Due to having the second main wall 56 and the second peripheral side-walls 57, the second casing body 53 forms an open shape that is open toward the front-face side of the cable unit 50.

As illustrated in FIG. 5 and FIG. 6, the first casing body 52 and the second casing body 53 are fitted together at respective open portion 52A, 53A sides thereof. More specifically, the upper wall and the pair of side-walls of the second peripheral side-walls 57 formed to the second casing body 53 are disposed at the outside of the upper wall and the pair of side-walls of the first peripheral side-walls 55 formed to the first casing body 52. A pair of slits 58 are formed in the lower wall of the first peripheral side-walls 55.

The pair of slits 58 extend along the front-rear direction of the cable unit 50, from a leading end of the lower wall of the first peripheral side-walls 55 toward the side of the first main wall 54. Lower portions of the pair of side-walls of the second peripheral side-walls 57 are respectively inserted into the pair of slits 58. The lower wall of the second peripheral side-walls 57 is disposed at the lower side of the lower wall of the first peripheral side-walls 55.

Thus, the leading end side of the second peripheral side-walls 57 forming the opened portion 53A overlaps with the leading end side of the first peripheral side-walls 55 forming the opened portion 52A. Then, in a state in which the leading end side of the second peripheral side-walls 57 overlaps the leading end side of the first peripheral side-walls 55, the second casing body 53 is fitted to the first casing body 52. In a state in which the first casing body 52 and the second casing body 53 are fitted together, the casing 51 forms a box shape. The casing 51 is of a size and shape able to be housed in the housing sections 30 described above (see FIG. 3).

As illustrated in FIG. 5 and FIG. 6, in a state in which the first casing body 52 and the second casing body 53 are fitted together, the first main wall 54 and the second main wall 56 face each other in the front-rear direction of the cable unit 50. The box-shaped casing 51 is telescopable in the front-rear direction of the cable unit 50 by sliding one of the first casing body 52 or the second casing body 53 relative to the other along the direction in which the first main wall 54 and the second main wall 56 face each other, namely, in the front-rear direction of the cable unit 50.

The first casing body 52 and the second casing body 53 each have electromagnetic shielding properties. The first casing body 52 and the second casing body 53 may be made of metal so as to have electromagnetic shielding properties. Alternatively, a metal member, covering, or the like may be applied to the inner faces and outer faces of the first casing body 52 and the second casing body 53 so as to provide electromagnetic shielding properties.

As illustrated in FIG. 5, plural first connectors 61 are provided to the first main wall 54. The plural first connectors 61 are arrayed in the up-down direction of the cable unit 50. Similarly, as illustrated in FIG. 6, plural second connectors 62 are provided to the second main wall 56. The plural second connectors 62 are arrayed in the up-down direction of the cable unit 50.

Figure 7:
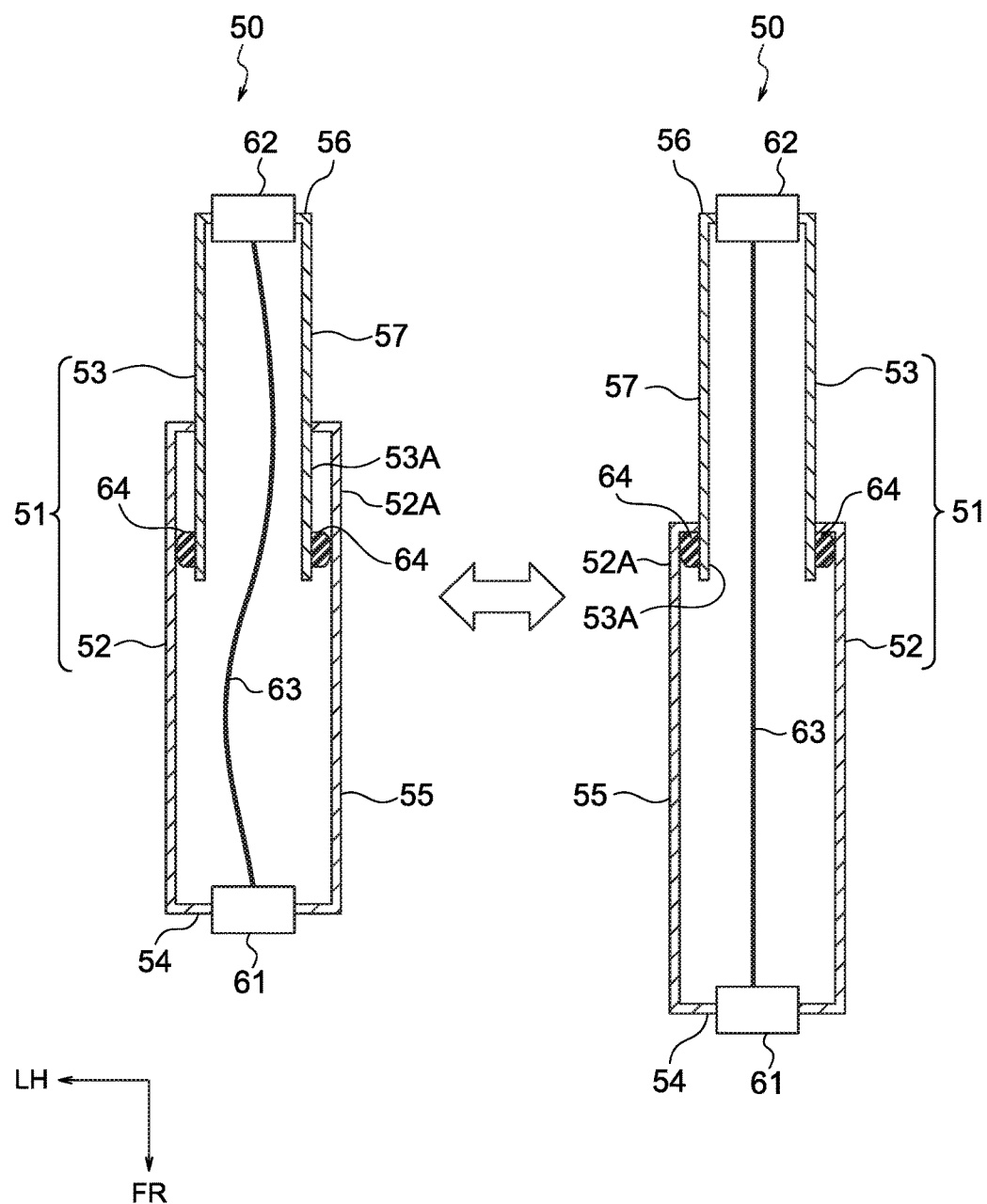
FIG. 7 is a top cross-section view illustrating telescoping of the cable unit of FIG. 3.
Figure 8:
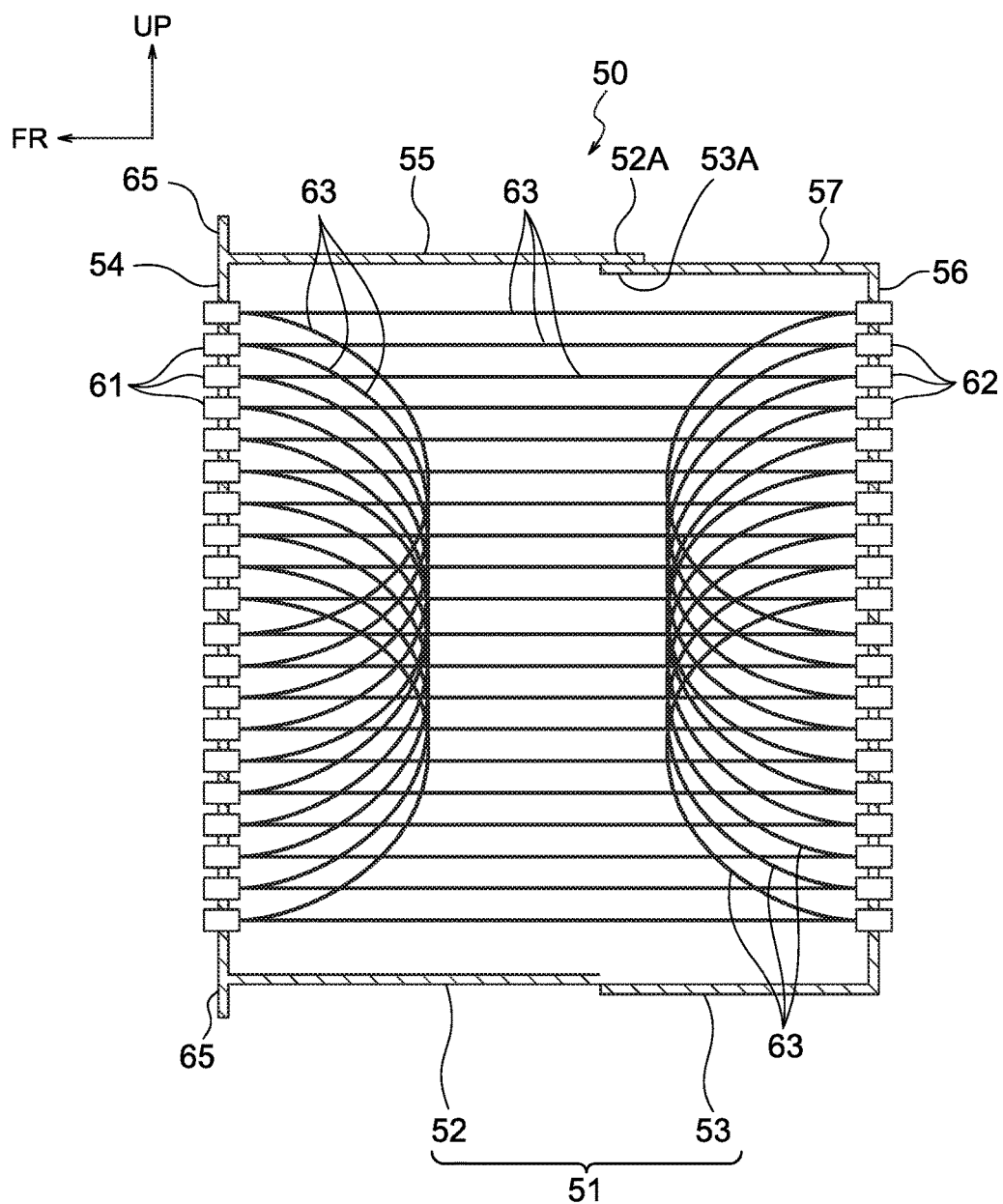
FIG. 8 is a side cross-section view illustrating internal configuration of the cable unit of FIG. 3.

As illustrated in FIG. 7 and FIG. 8, plural cables 63 are housed in the casing 51. Each of the cables 63 connects one of the plural first connectors 61 to one of the plural second connectors 62. Since electromagnetic shielding is secured by the first casing body 52 and the second casing body 53, non-shielded cables, namely cables that do not include electromagnetic shielding material, are be adopted as the cables 63.

As illustrated in FIG. 7, a shielding member 64 with electromagnetic shielding properties is provided to the leading end side of the second peripheral side-walls 57 formed to the second casing body 53. The crown of the shielding member 64 provided to the leading end side of the second peripheral side-walls 57 contacts the inner faces of the first peripheral side-walls 55. Electromagnetic shielding between the first peripheral side-walls 55 and the second peripheral side-walls 57 is secured due to the crown of the shielding member 64 making contact with the inner faces of the first peripheral side-walls 55.

As illustrated in FIG. 5 and FIG. 6, a positioning piece 65 is formed at each of the upper end and the lower end of the first main wall 54. The positioning piece 65 at the upper side extends upward from the upper end of the first main wall 54, and the positioning piece 65 at the lower side extends downward from the lower end of the first main wall 54. The first main wall 54 and the pair of upper and lower positioning pieces 65 form a flat plate shape extending in the up-down direction of the cable unit 50.

A first guide pin 66 and a through hole 67 are provided to each of the positioning pieces 65. The first guide pin 66 and the through hole 67 are aligned in the left-right direction of the cable unit 50. The first guide pin 66 extends from the positioning piece 65 toward the side of the second main wall 56, namely, toward the back-face side of the cable unit 50. The through hole 67 penetrates the positioning piece 65 along its thickness direction, namely, in the front-rear direction of the cable unit 50.

As illustrated in FIG. 6, a second guide pin 68 and a screw hole 69 are provided to both an upper portion and a lower portion of the second main wall 56. The second guide pin 68 and the screw hole 69 are aligned in the left-right direction of the cable unit 50. The second guide pin 68 extends from the second main wall 56 toward the side opposite to the first main wall 54, namely, toward the rear of the cable unit 50. The screw hole 69 penetrates the second main wall 56 along its thickness direction, namely, in the front-rear direction of the cable unit 50.

Back Panel, Positioning Panel, and Shelves

Figure 9:
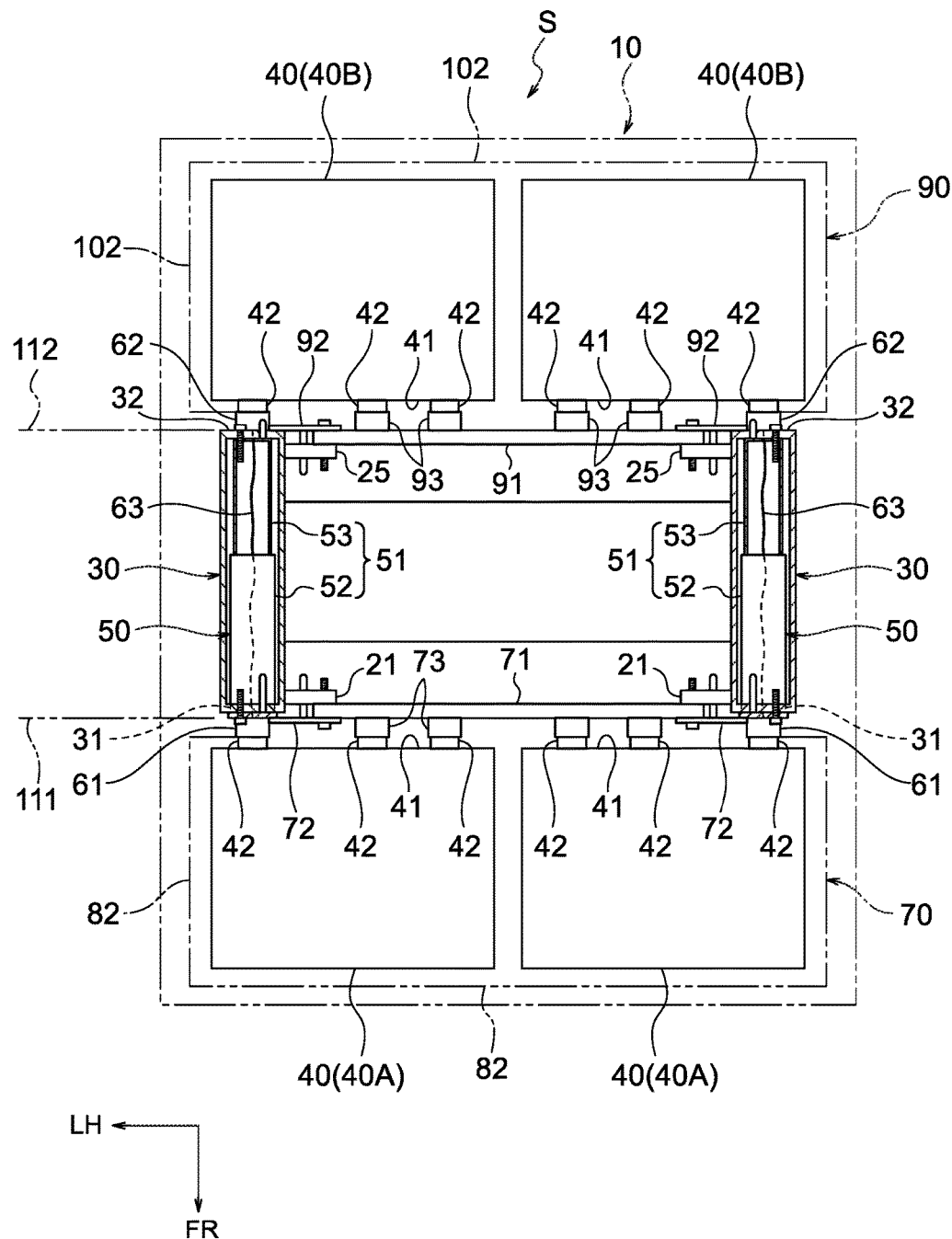
FIG. 9 is a top cross-section view of the server apparatus of FIG. 1.

As illustrated in FIG. 9, a first back panel 71 is disposed at the back-face side of the first electronic units 40A. A first positioning panel 72 is provided to each left-right direction side of the first back panel 71. Similarly, a second back panel 91 is disposed at the back-face side of the second electronic units 40B. A second positioning panel 92 is provided to each left-right direction side of the second back panel 91. The first back panel 71, the first positioning panels 72, the second back panel 91, and the second positioning panel 92 are all disposed with their plate thickness directions in the front-rear direction of the rack 10.

Figure 10:
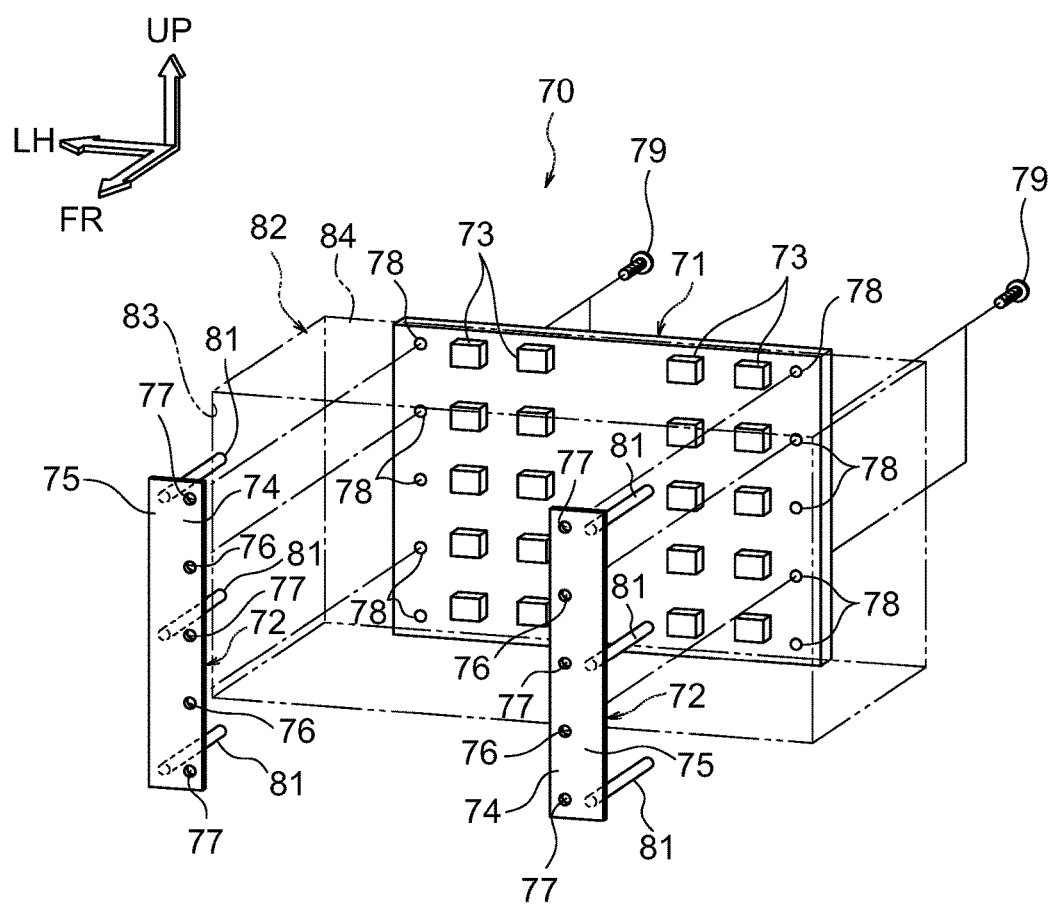
FIG. 10 is an exploded perspective view of a first back panel unit of FIG. 9.

As illustrated in FIG. 10, plural third connectors 73 are mounted on the first back panel 71. The pair of first positioning panels 72 are formed in rectangular shapes with their length directions in the up-down direction of the first back panel 71. The pair of first positioning panels 72 are formed with left-right direction symmetry about the first back panel 71. Each first positioning panel 72 includes a fixing portion 74 and an attachment portion 75. In more detail, the fixing portion 74 and the attachment portion 75 are side-by-side in the left-right direction of each first positioning panel 72.

Plural screw holes 76 and plural through holes 77 are formed in each fixing portion 74. Each of the plural screw holes 76 and the plural through holes 77 penetrates the respective first positioning panel 72 along its plate thickness direction. The plural screw holes 76 and the plural through holes 77 are aligned in the up-down direction of the first positioning panel 72. Through holes 78 are also formed in the first back panel 71 at positions corresponding to the plural screw holes 76 and the plural through holes 77.

Figure 11:
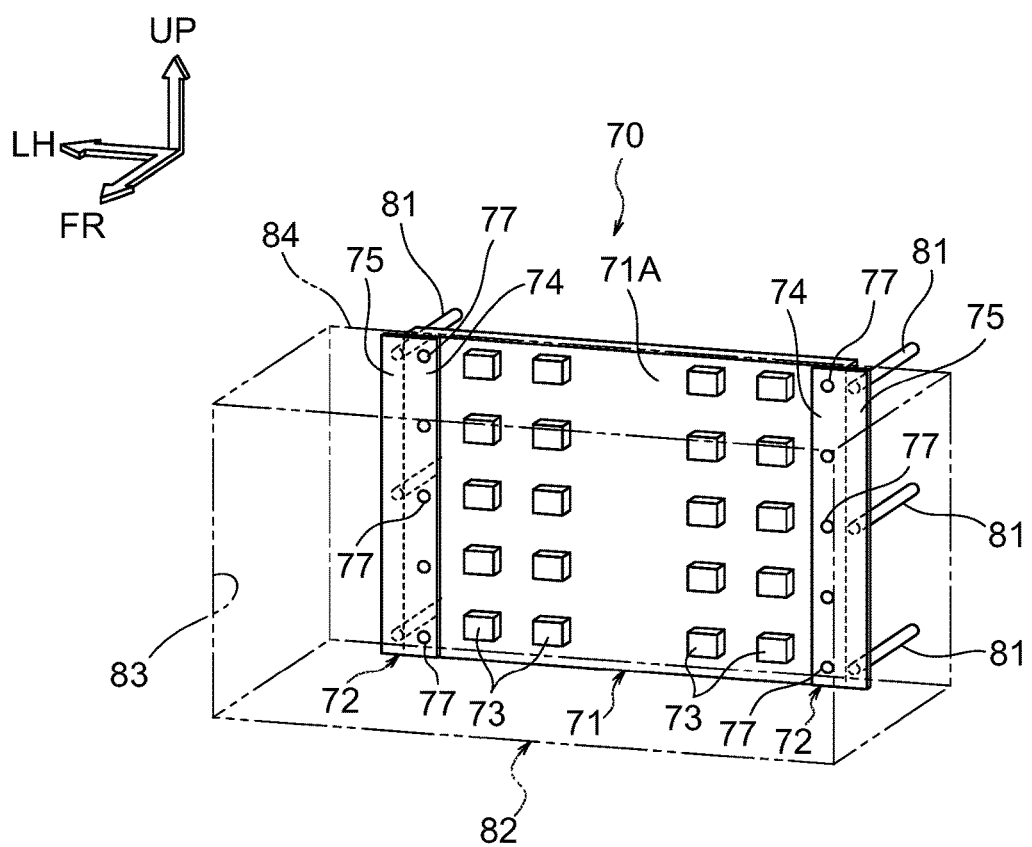
FIG. 11 is a perspective view illustrating an assembled state of the first back panel unit of FIG. 9.

Each fixing portion 74 is overlaid onto a mounting face 71A for the third connectors 73 on the first back panel 71 (see FIG. 11). Screws 79 are inserted into the through holes 78 from the opposite side of the first back panel 71 to the mounting face 71A, and the screws 79 are screwed into the screw holes 76 of the first positioning panels 72 so as to fix the fixing portions 74 of the first positioning panels 72 to the first back panel 71.

As illustrated in FIG. 11, in a state in which the fixing portions 74 have been fixed to the mounting face 71A of the first back panel 71, the attachment portions 75 project out toward the sides from left-right direction end portions of the first back panel 71. Plural first positioning pins 81 are provided to each attachment portion 75. The plural first positioning pins 81 are aligned in the up-down direction of the first positioning panel 72. In a state in which the fixing portions 74 have been fixed to the mounting face 71A of the first back panel 71, the plural first positioning pins 81 are positioned to the sides of the first back panel 71 and extend in the opposite direction to the direction faced by the third connectors 73.

The first back panel 71 and the pair of first positioning panels 72 are fitted to a first shelf 82 so as to form a unit. The first shelf 82 is formed in a box shape having an opening 83 at its front-face side and an end wall 84 at its back-face side. The first back panel 71 and the pair of first positioning panels 72 described above are housed in the first shelf 82 with the first back panel 71 and the first positioning panel 72 being overlaid onto the end wall 84. The plural first positioning pins 81 described above pass through the end wall 84 of the first shelf 82. Openings (not illustrated in the drawings) are formed in the end wall 84 of the first shelf 82 at positions corresponding to the through holes 77 described above. The first back panel 71, the pair of first positioning panels 72, and the first shelf 82 configure a first back panel unit 70.

Figure 12:
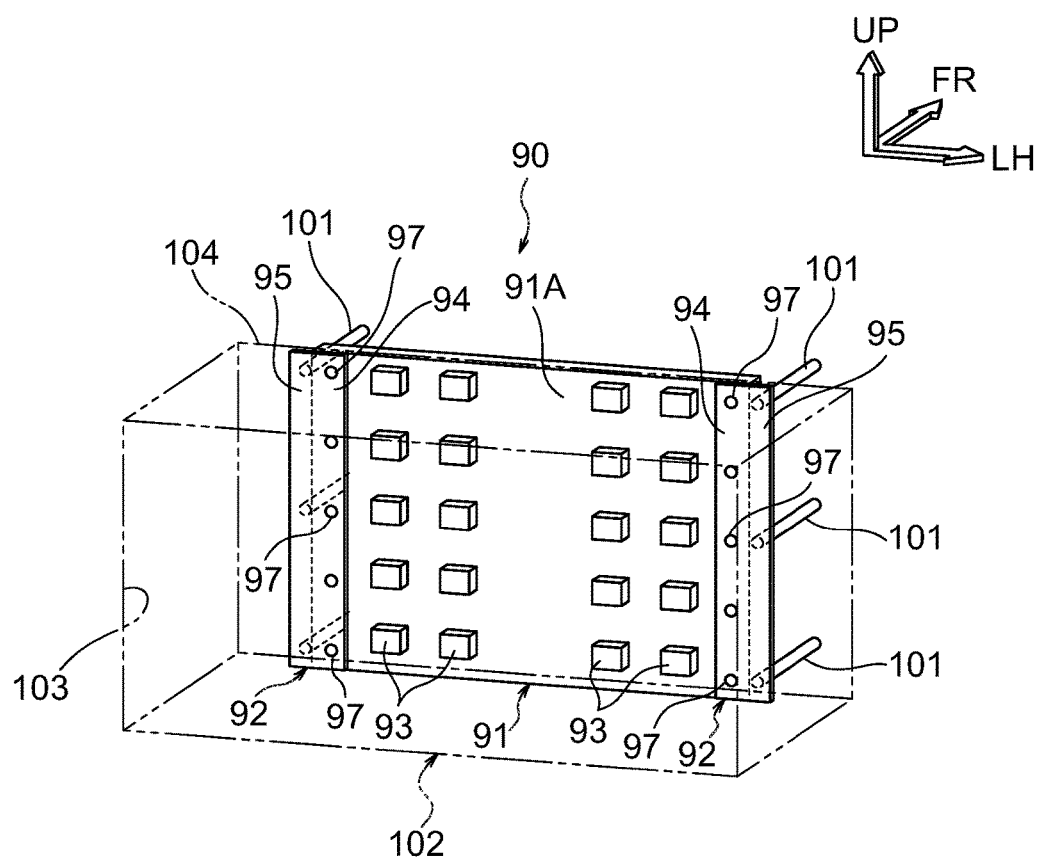
FIG. 12 is a perspective view illustrating an assembled state of a second back panel unit of FIG. 9.

By contrast, as illustrated in FIG. 12, the second back panel 91 and the pair of second positioning panels 92 are fitted to a second shelf 102 so as to form a unit. The second back panel 91, the pair of second positioning panels 92, and the second shelf 102 configure a second back panel unit 90. The first back panel unit 70 and the second back panel unit 90 can be implemented by identical components. The second back panel unit 90 is formed with front-rear direction symmetry to the first back panel unit 70 described above (see FIG. 11), except for that the board configuration of the second back panel 91 differs from the board configuration of the first back panel 71 described above.

Plural fourth connectors 93 are mounted on the second back panel 91. Each second positioning panel 92 includes a fixing portion 94 and an attachment portion 95. Each fixing portion 94 is overlaid and fixed onto a mounting face 91A for the fourth connectors 93 on the second back panel 91.

In a state in which the fixing portions 94 have been fixed to the mounting face 91A of the second back panel 91, the attachment portions 95 project out toward the sides from left-right direction end portions of the second back panel 91. Plural second positioning pins 101 are provided to each attachment portion 95. In a state in which the fixing portions 94 have been fixed to the mounting face 91A of the second back panel 91, the plural second positioning pins 101 are positioned to the sides of the second back panel 91 and extend in the opposite direction to the direction faced by the fourth connectors 93.

More detailed explanation follows regarding the structure of the server apparatus S in conjunction with a method of mounting the cable units 50, the first back panel units 70, the second back panel units 90, and the electronic units 40 to the rack 10.

Mounting Cable Units to Rack

Figure 13:
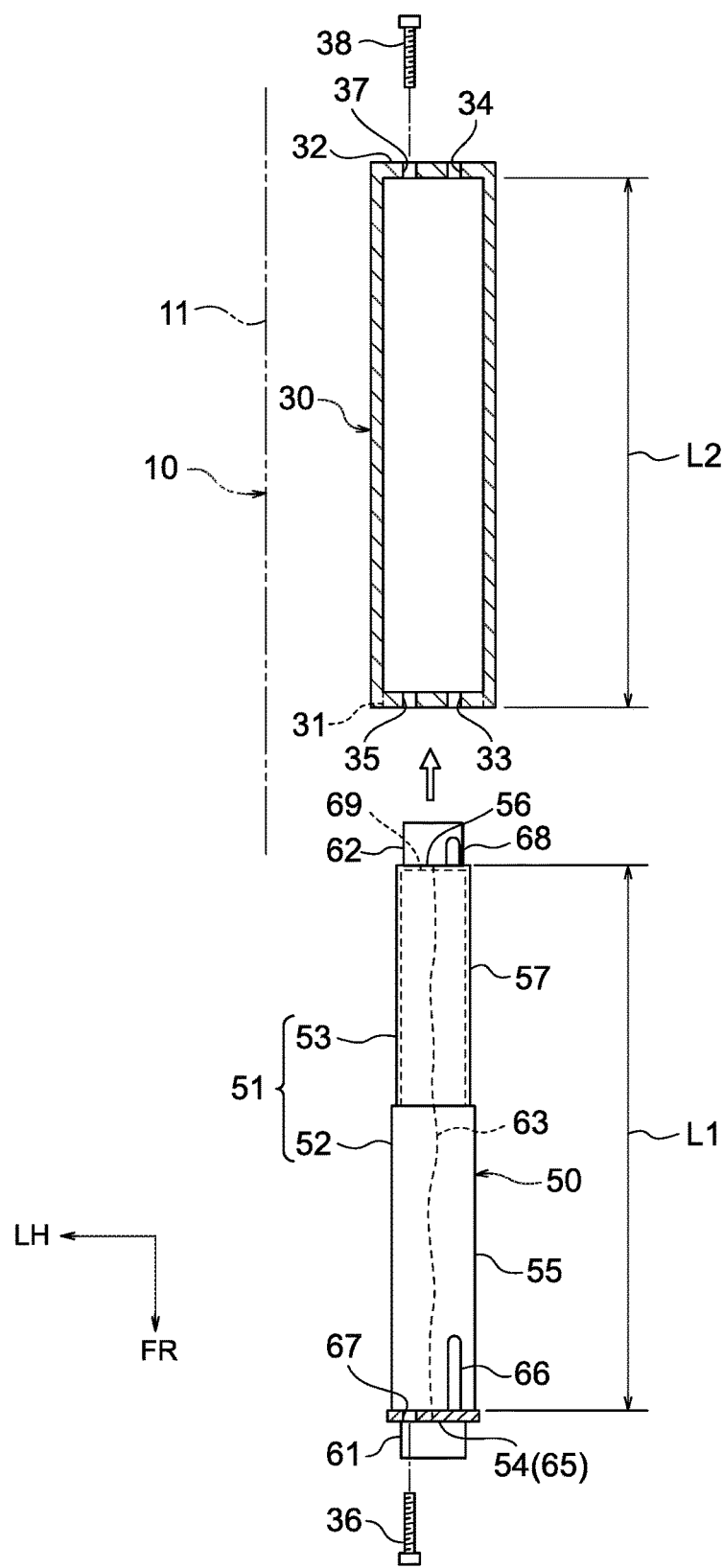
FIG. 13 is a top cross-section view illustrating insertion of the cable unit of FIG. 9 into a housing section of a rack.

First, as illustrated in FIG. 13, a pre-assembled cable unit 50 is inserted, from the front-face side of the rack 10, into a housing section 30 through the opening 31 of the housing section 30 (also see FIG. 2). The cable unit 50 is inserted into the housing section 30 from the second casing body 53 side such that the first casing body 52 is disposed at the front-face side of the rack 10 and the second casing body 53 is disposed at the back-face side of the rack 10 when this is performed.

First guide holes 33 that penetrate the housing section 30 along the front-rear direction are formed in the rim of the opening 31 of the housing section 30 (at the upper end and lower end of the front-face wall of the housing section 30). The first guide pins 66 provided to the positioning pieces 65 of the cable unit 50 are inserted into the first guide holes 33. Second guide holes 34 that penetrate the housing section 30 along the front-rear direction are also formed in the end wall 32 of the housing section 30 (at the upper end and lower end of the back-face wall of the housing section 30). The second guide pins 68 provided to the second main wall 56 of the cable unit 50 are inserted into the second guide holes 34. The cable unit 50 is inserted into the housing section 30 while being positioned relative thereto by respective insertion of the first guide pins 66 and the second guide pins 68 into the first guide holes 33 and the second guide holes 34.

In a state in which the cable unit 50 is housed in the housing section 30, the first casing body 52 has an open shape that is open toward the back-face side of rack 10, and the second casing body 53 has an open shape that is open toward the front-face side of the rack 10. The first casing body 52 and the second casing body 53 are fitted together at respective open portion sides thereof. The casing 51 including the first main wall 54 and the second main wall 56 expands and contracts in the direction the first main wall 54 and the second main wall 56 face each other, namely, in the front-rear direction of the rack 10 (the housing section 30).

Due to variations in the components or assembly dimensions of the cable unit 50, or due to telescoping of the casing 51, the front-rear direction length L1 of the cable unit 50 is sometimes differs from the front-rear direction length L2 of the housing section 30. Length L1 is the length between the back face of the first main wall 54 and the back face of the second main wall 56, and length L2 is the length between the front face of the rim of the opening 31 of the housing section 30 and the front face of the end wall 32.

In cases in which length L1 is longer than length L2, the cable unit 50 is inserted into the housing section 30 until the second main wall 56 of the cable unit 50 abuts the end wall 32 of the housing section 30 from the front-face side of the rack 10. In contrast, in cases in which length L1 is shorter than length L2, the cable unit 50 is inserted into the housing section 30 until the positioning pieces 65 formed to the first main wall 54 of the cable unit 50 abut the rim of the opening 31 of the housing section 30 from the front-face side of the rack 10.

Figure 14:
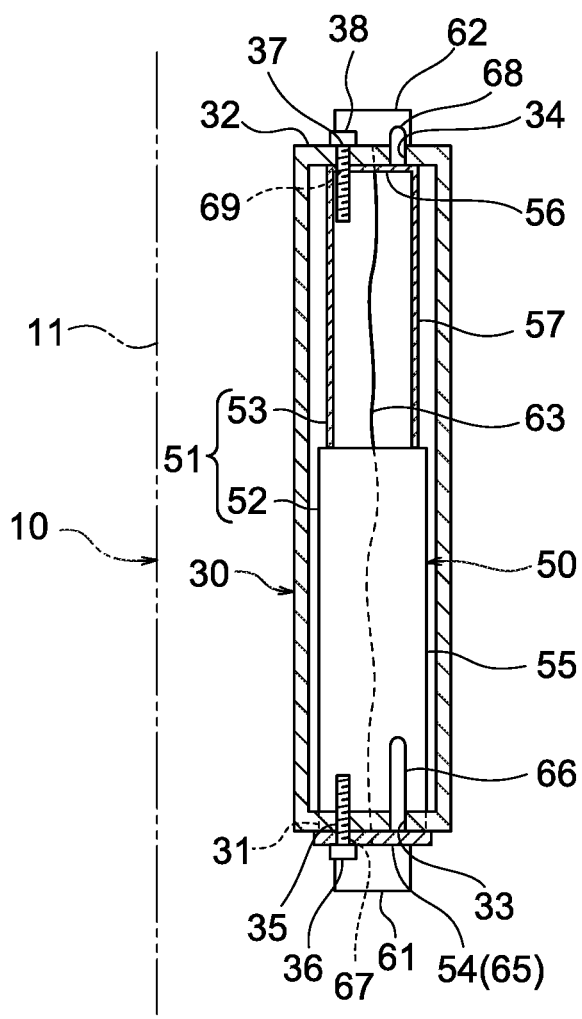
FIG. 14 is a top cross-section view illustrating a state in which the cable unit of FIG. 9 has been inserted into a housing section of a rack.

As illustrated in FIG. 13 and FIG. 14, screw holes 35 that penetrate the housing section 30 along the front-rear direction are formed in the rim of the opening 31 of the housing section 30. Screws 36 are inserted from the front-face side of the rack 10 into the through holes 67 of the positioning pieces 65, and the screws 36 are screwed into the screw holes 35 formed in the rim of the opening 31 of the housing section 30 so as to fix the positioning pieces 65 in a state abutting the rim of the opening 31 of the housing section 30.

For example, in cases in which length L1 is longer than length L2, the second main wall 56 of the cable unit 50 abuts the end wall 32 of the housing section 30 from the front-face side of the rack 10, and the positioning pieces 65 of the first main wall 54 may be spaced apart from the rim of the opening 31. In such cases, when the screws 36 are screwed into the screw holes 35, the positioning pieces 65 are pushed in toward the housing section 30 side by the heads of the screws 36, such that the first casing body 52 slides toward the back-face side of the rack 10 relative to the second casing body 53 and the casing 51 contracts in the front-rear direction. Accompanying sliding of the first casing body 52 toward the back-face side of the rack 10, the positioning pieces 65 are abutted against the rim of the opening 31 from the front-face side of the rack 10 and the positioning pieces 65 are fixed to the rim of the opening 31.

Note that in cases in which length L1 is longer than length L2, when the second main wall 56 of the cable unit 50 abuts the end wall 32 of the housing section 30 from the front-face side of the rack 10 and the positioning pieces 65 of the first main wall 54 are spaced apart from the rim of the opening 31, configuration may also be as follows. Namely, an operator may push the first main wall 54 in toward the housing section 30 side by hand, such that the first casing body 52 is caused to slide toward the back-face side of the rack 10 relative to the second casing body 53 and the casing 51 contracts in the front-rear direction. Then, the positioning pieces 65 may be abutted against the rim of the opening 31 from the front-face side of the rack 10, the screws 36 screwed into the screw holes 35, and the positioning piece 65 fixed to the rim of the opening 31.

As illustrated in FIG. 13 and FIG. 14, through holes 37 that penetrate the housing section 30 along the front-rear direction are formed in the end wall 32 of the housing section 30. Screws 38 are inserted from the back-face side of the rack 10 into the through holes 37 of the end wall 32, and the screws 38 are screwed into the screw holes 69 of the second main wall 56 so as to fix the second main wall 56 in a state abutting the end wall 32.

For example, in cases in which length L1 is shorter than length L2, the positioning pieces 65 of the first main wall 54 abut the rim of the opening 31, and the second main wall 56 may be spaced apart from the end wall 32 of the housing section 30. In such cases, when the screws 38 are screwed into the screw holes 69, the second main wall 56 is pulled toward the end wall 32 by the screws 38, such that the second casing body 53 slides toward the back-face side of the rack 10 relative to the first casing body 52 and the casing 51 expands in the front-rear direction. Accompanying sliding of the second casing body 53 toward the back-face side of the rack 10, the second main wall 56 is abutted against the end wall 32 from the front-face side of the rack 10 and the second main wall 56 is fixed to the end wall 32.

In the server apparatus S of the present exemplary embodiment, the casing 51 expands and contracts in this manner even if the length L1 of the cable unit 50 differs from the length L2 of the housing section 30 due to variations in the components or assembly dimensions of the cable unit 50. As a result of telescoping of the casing 51, differences between the length L1 of the cable unit 50 and the length L2 of the housing section 30 are absorbed, the positioning pieces 65 are abutted against the rim of the opening 31 of the housing section 30, and the second main wall 56 adopts a state abutting the end wall 32.

As illustrated in FIG. 14, in a state in which the positioning pieces 65 are fixed to the rim of the opening 31, the first connectors 61 project out toward the front-face side of the rack 10 relative to the first main wall 54. Openings (not illustrated in the drawings) are formed in the end wall 32 at positions corresponding to the second connectors 62. When the second connectors 62 are inserted into these openings, the second connectors 62 pass through the end wall 32 and project out toward the back-face side of the rack 10 relative to the end wall 32.

Mounting Back Panel Unit to Rack

Figure 15:
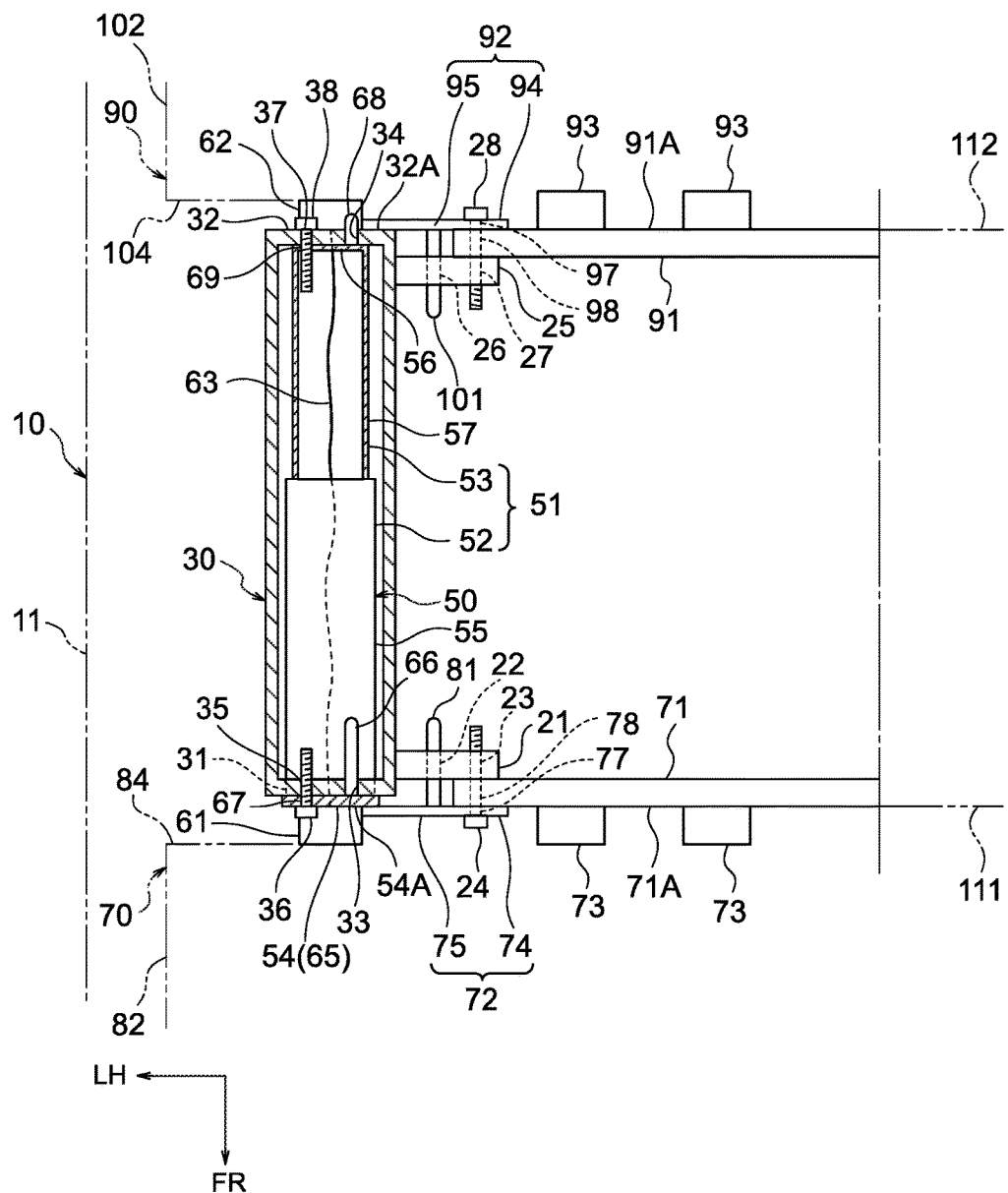
FIG. 15 is a top cross-section view illustrating half of one side of the first back panel unit and the second back panel unit of FIG. 9 in a state mounted in a rack.

Next, as illustrated in FIG. 15, a pre-assembled first back panel unit 70 is inserted into the rack 10 from the front-face side of the rack 10. FIG. 15 illustrates the left side half of the first back panel unit 70. The right side half of the first back panel unit 70 has left-right symmetry with the left side half of the first back panel unit 70, and so explanation thereof is omitted.

In the rack 10, a first fixing portion 21 is disposed at a position on the rack 10 back-face side of the first back panel 71. The first fixing portion 21 is formed in a plate shape with its plate thickness direction in the front-rear direction of the rack 10. First positioning holes 22 that penetrate the rack 10 in the front-rear direction are formed in the first fixing portion 21. The first positioning pins 81 provided to the attachment portion 75 of the respective first positioning panel 72 are inserted into the first positioning holes 22.

The first back panel unit 70 is inserted into the rack 10 while being positioned relative thereto due to insertion of the first positioning pins 81 into the first positioning holes 22. The first positioning panel 72 is provided to the mounting face 71A for the third connectors 73 on the first back panel 71. The first positioning panel 72 extends to the side of the first back panel 71, namely to a side-face side of the rack 10 (the first main wall 54 side). The first back panel unit 70 is inserted into the rack 10 until the portion of the first positioning panel 72 that extends to the side of the first back panel 71, namely the attachment portion 75, abuts the first main wall 54 from the front-face side of the rack 10.

Screw holes 23 that penetrate the rack 10 along the front-rear direction are formed in the first fixing portion 21. Screws 24 are inserted from the front-face side of the rack 10 into the through holes 77 of the first positioning panel 72 and into the through holes 78 of the first back panel 71. The screws 24 are screwed into the screw holes 23 of the first fixing portion 21 so as to fix the first back panel 71 and the first positioning panel 72 to the first fixing portion 21.

In a state in which the attachment portion 75 of the first positioning panel 72 abuts the first main wall 54 from the front-face side of the rack 10 and the first back panel 71 is fixed to the first fixing portion 21, the first back panel 71 is disposed at the side of the first main wall 54. The third connectors 73 mounted on the first back panel 71 face the front-face side of the rack 10.

Further, in a state in which the attachment portion 75 of the first positioning panel 72 abuts the first main wall 54 from the front-face side of the rack 10, the front face 54A of the first main wall 54 is disposed in the same plane as the mounting face 71A for the third connectors 73 on the first back panel 71. Namely, a front face 54A of the first main wall 54 and the mounting face 71A of the first back panel 71 are disposed at the same position in the front-rear direction of the rack 10 so as to be positioned flush with each other. The front face 54A of the first main wall 54 and the mounting face 71A of the first back panel 71 form a rack front-face-side reference plane 111 that defines mounting positions for the first electronic units 40A (see FIG. 9), described later, relative to the rack 10.

Similarly, as illustrated in FIG. 15, a pre-assembled second back panel unit 90 is inserted into the rack 10 from the back-face side of the rack 10. FIG. 15 illustrates the left side half of the second back panel unit 90. The right side half of the second back panel unit 90 has left-right symmetry with the left side half of the second back panel unit 90, and so explanation thereof is omitted.

In the rack 10, a second fixing portion 25 is disposed at a position on the rack 10 front-face side of the second back panel 91. The second fixing portion 25 is formed in a plate shape with its plate thickness direction in the front-rear direction of the rack 10. Second positioning holes 26 that penetrate the rack 10 in the front-rear direction are formed in the second fixing portion 25. The second positioning pins 101 provided to the attachment portions 95 of the respective second positioning panel 92 are inserted into the second positioning holes 26.

The second back panel unit 90 is inserted into the rack 10 while being positioned relative thereto due to insertion of the second positioning pins 101 into the second positioning holes 26. The second positioning panel 92 is provided to the mounting face 91A for the fourth connectors 93 on the second back panel 91. The second positioning panel 92 extends to the side of the second back panel 91, namely to a side-face side of the rack 10 (the end wall 32 side). The second back panel unit 90 is inserted into the rack 10 until the portion of the second positioning panel 92 that extends to the side of the second back panel 91, namely the attachment portion 95, abuts the end wall 32 of the housing section 30 from the back-face side of the rack 10.

Screw holes 27 that penetrate the rack 10 along the front-rear direction are formed in the second fixing portion 25. Screws 28 are inserted from the back-face side of the rack 10 into the through holes 97 of the second positioning panel 92 and into the through holes 98 of the second back panel 91. The screws 28 are screwed into the screw holes 27 of the second fixing portion 25 so as to fix the second back panel 91 and the second positioning panel 92 to the second fixing portion 25.

In a state in which the attachment portion 95 of the second positioning panel 92 abuts the end wall 32 of the housing section 30 from the back-face side of the rack 10 and the second back panel 91 is fixed to the second fixing portion 25, the second back panel 91 is disposed at the side of the second main wall 56 and the end wall 32. The fourth connectors 93 mounted on the second back panel 91 face the back-face side of the rack 10.

Further, in a state in which the attachment portion 95 of the second positioning panel 92 abuts the end wall 32 of the housing section 30 from the back-face side of the rack 10, a back face 32A of the end wall 32 is disposed in the same plane as the mounting face 91A for the fourth connectors 93 on the second back panel 91. Namely, the back face 32A of the end wall 32 and the mounting face 91A of the second back panel 91 are disposed at the same position in the front-rear direction of the rack 10 so as to be positioned flush with each other. The back face 32A of the end wall 32 and the mounting face 91A of the second back panel 91 form a rack back-face-side reference plane 112 that defines mounting positions for the second electronic units 40B, described later, relative to the rack 10.

Mounting Electronic Unit to Rack

Next, as illustrated in FIG. 9, first electronic units 40A are inserted into the rack 10 from the front-face side of the rack 10. The first electronic units 40A are housed in the first shelf 82 provided to the first back panel unit 70, and are disposed relative to the rack front-face-side reference plane 111. A back face 41 of each first electronic unit 40A faces the back-face side of the rack 10.

When the first electronic units 40A are disposed relative to the rack front-face-side reference plane 111, back-face connectors 42 of the first electronic units 40A are connected to the first connectors 61 provided to the first main wall 54 and the third connectors 73 provided to the first back panel 71.

Similarly, as illustrated in FIG. 9, second electronic units 40B are inserted into the rack 10 from the back-face side of the rack 10. The second electronic units 40B are housed in the second shelf 102 provided to the second back panel unit 90, and are disposed relative to the rack back-face-side reference plane 112. A back face 41 of each second electronic unit 40B faces the front-face side of the rack 10.

When the second electronic units 40B are disposed relative to the rack back-face-side reference plane 112, back-face connectors 42 of the second electronic units 40B are connected to the second connectors 62 provided to the second main wall 56 and the fourth connectors 93 provided to the second back panel 91.

Thus, when plural first electronic units 40A and plural second electronic units 40B are mounted to the rack 10, the cable units 50 is disposed between respective first electronic units 40A and second electronic units 40B aligned in the front-rear direction of the rack 10. The first main wall 54 of each cable unit 50 opposes the back faces 41 of the first electronic units 40A through the opening 31 of the housing section 30, and the second main wall 56 of each cable unit 50 opposes the back faces 41 of the second electronic units 40B across the end wall 32 of the housing section 30.

The first electronic units 40A and the second electronic units 40B aligned in the front-rear direction of the rack 10 are connected by the cable units 50. In addition, pairs of the first electronic units 40A aligned in the left-right direction of the rack 10 are connected by the first back panel 71, and pairs of the second electronic units 40B aligned in the left-right direction of the rack 10 are connected by the second back panel 91. Cable units 50, first back panel units 70, second back panel units 90, and the electronic units 40 are mounted to the rack 10 in the manner described above.

Explanation follows regarding the operation and advantageous effects of the present exemplary embodiment.

(1) As illustrated in FIG. 9, in the server apparatus S, after cable units 50 are mounted to the rack 10, front-face side and back-face-side electronic units 40 are mounted to the rack 10 such that the front-face side and the back-face-side electronic units 40 are able to be connected by the cables 63. Accordingly, an operation to connect the electronic units 40 by the cables 63 is unnecessary in a state in which the electronic units 40 have been mounted to the rack 10. Thus, working space can be reduced and the wiring space for the cables 63 can be reduced. As a result, space savings can be achieved and the transmission distance between electronic units 40 can be shortened, enabling high-density mounting of the electronic units 40 and high speed transmission between electronic units 40 to be realized.

(2) As illustrated in FIG. 9, the casing 51 of each cable unit 50 includes the first casing body 52 and the second casing body 53. One of the first casing body 52 or the second casing body 53 is slidable in the front-rear direction of the rack 10 relative to the other. Accordingly, even if there are variations in the components or assembly dimensions of the cable unit 50, one of the first casing body 52 or the second casing body 53 slides relative to the other such that the casing 51 expands and contracts to adjust to the distance between electronic units 40. This enables a poor fit between the connectors of electronic units 40 and the cable units 50 to be suppressed even when there are variations in the components or assembly dimensions of the cable unit 50. As a result, the electronic units 40 are able to be appropriately connected by the cable units 50.

(3) As illustrated in FIG. 5, specifically, each casing 51 includes the first casing body 52, which has an open shape and includes the first main wall 54 and the first peripheral side-walls 55, and the second casing body 53, which has an open shape and includes the second main wall 56 and the second peripheral side-walls 57. The first casing body 52 and the second casing body 53 are fitted together at respective open portion 52A, 53A sides thereof. Accordingly, when a cable unit 50 is mounted to the rack 10 as illustrated in FIG. 3, bending of the casing 51 such as that which would occur if the casing 51 were bellows-shaped can be suppressed. This enables the ease of an operation to mount cable units 50 to the rack 10 to be improved.

Moreover, since by fitting the first casing body 52 and the second casing body 53 together at respective open portion 52A, 53A sides thereof, bending of the casing 51 such as that which would occur if the casing 51 were bellows-shaped can be suppressed as described above, guide structures when mounting casings 51 to the rack 10 can be simplified. Accordingly, the installation space for guide structures can be reduced, enabling high-density mounting of the electronic units 40 to be realized. Moreover, bent portions (bellows portions) in the casing 51 such as that which would exist if the casing 51 were bellows-shaped do not arise, enabling high-density mounting of the electronic units 40 to be realized as a result of space savings.

(4) As illustrated in FIG. 5, the second casing body 53 is fitted to the first casing body 52 in a state in which the leading end side of the second peripheral side-walls 57 overlaps the leading end side of the first peripheral side-walls 55. Accordingly, since the first casing body 52 and the second casing body 53 are able to be firmly fitted together, bending of the casing 51 when the cable unit 50 is mounted to the rack 10 can be effectively suppressed. This enables the ease of an operation to mount cable units 50 to the rack 10 to be even further improved.

(5) The first casing body 52 and the second casing body 53 illustrated in FIG. 7, etc., each have electromagnetic shielding properties. Accordingly, since the first casing body 52 and the second casing body 53 secure electromagnetic shielding of the cables 63, non-shielded cables, namely cables that do not include electromagnetic shielding material, may be adopted as the cables 63. The cables 63 can thus be made thinner, enabling the size of the cable units 50 to be reduced, and by extension enable high-density mounting of the electronic units 40 to be even more effectively realized as a result of space savings.

(6) As illustrated in FIG. 13 and FIG. 14, each cable unit 50 is passed through the opening 31 (also see FIG. 3) of the respective housing section 30 provided to the rack 10 so as to be housed in the housing section 30. The first main wall 54 of the cable unit 50 includes positioning pieces 65 that are abutted against the rim of the opening 31 of the housing section 30 from the front-face side of the rack 10, and the second main wall 56 of the cable unit 50 abuts the end wall 32 from the front-face side of the rack 10. Accordingly, the front-rear direction length of the cable unit 50 can be defined by abutting the positioning pieces 65 against the rim of the opening 31 and abutting the second main wall 56 against the end wall 32. Thus, the front-rear direction length of the cable unit 50 does not have to be adjusted in advance by a manual operation or the like so as to accord with the mounting positions of front-face side and back-face-side electronic units 40, enabling the ease of an operation to mount cable units 50 to the rack 10 to be improved.

(7) As illustrated in FIG. 13 and FIG. 14, the first guide pins 66 are provided to the positioning pieces 65, and the first guide holes 33 into which the first guide pins 66 are inserted are formed in the rim of the opening 31 of the housing section 30. In addition, the second guide pins 68 are provided to the second main wall 56, and the second guide holes 34 into which the second guide pins 68 are inserted are formed in the end wall 32 of the housing section 30. Accordingly, when the cable unit 50 is inserted into the housing section 30, the first guide pins 66 are inserted into the first guide holes 33 and the second guide pins 68 are inserted into the second guide holes 34, thereby enabling the cable unit 50 to be positioned relative to the housing section 30. This enables the ease of an operation to mount cable units 50 to the rack 10 to be improved.

(8) As illustrated in FIG. 15, the first back panel 71, upon which the third connectors 73 are mounted so as to face the front-face side of the rack 10, is disposed at the side of the first main wall 54. The first positioning panel 72 extending toward the first main wall 54 side is provided to the mounting face 71A for the third connectors 73 on the first back panel 71. The first positioning panel 72 abuts the first main wall 54 from the front-face side of the rack 10. Accordingly, the rack front-face-side reference plane 111 is defined by the front face 54A of the first main wall 54 and the mounting face 71A of the first back panel 71, enabling the front-face-side electronic units 40 to be mounted to the rack 10 relative to the rack front-face-side reference plane 111.

Similarly, the second back panel 91, upon which the fourth connectors 93 are mounted so as to face the back-face side of the rack 10, is disposed at the side of the second main wall 56. The second positioning panel 92 extending toward the end wall 32 side of the housing section 30 is provided to the mounting face 91A for the fourth connectors 93 on the second back panel 91. The second positioning panel 92 abuts the end wall 32 from the back-face side of the rack 10. Accordingly, the rack back-face-side reference plane 112 is defined by the back face 32A of the end wall 32 and the mounting face 91A of the second back panel 91, enabling the back-face-side electronic units 40 to be mounted to the rack 10 relative to the rack back-face-side reference plane 112.

Thus, in the server apparatus S, the front-face side and back-face-side electronic units 40 can each be individually mounted to the rack 10 relative to the rack front-face-side reference plane 111 and the rack back-face-side reference plane 112. Accordingly, the positions of respective front-face-side electronic units 40 and the positions of respective back-face-side electronic units 40 can be arranged more precisely along the front-rear direction of the rack 10 than in cases in which reference is made using one common reference plane.

(9) As illustrated in FIG. 15, in a state in which the first positioning panel 72 abuts the first main wall 54 from the front-face side of the rack 10, the front face 54A of the first main wall 54, from which the first connectors 61 project, is disposed in the same plane as the mounting face 71A of the first back panel 71. Accordingly, when front-face-side electronic units 40 have been inserted into the rack 10, the back-face connectors 42 of the electronic units 40 are connected to the first connectors 61 and the third connectors 73 simultaneously. This enables the back-face connectors 42 of the electronic units 40 to be appropriately connected to the first connectors 61 and the third connectors 73.

Similarly, in a state in which the second positioning panel 92 abuts the end wall 32 from the back-face side of the rack 10, the back face 32A of the end wall 32, from which the second connectors 62 project, is disposed in the same plane as the mounting face 91A of the second back panel 91. Accordingly, when the back-face sides of second electronic units 40 are inserted into the rack 10, the back-face connectors 42 of the electronic units 40 are connected to the second connectors 62 and the fourth connectors 93 simultaneously. This enables the back-face connectors 42 of the electronic units 40 to be appropriately connected to the second connectors 62 and the fourth connectors 93.

(10) As illustrated in FIG. 15, the first positioning pins 81 are provided to the first positioning panel 72. In addition, the first positioning holes 22, into which the first positioning pins 81 are inserted, are formed in the first fixing portion 21 of the rack 10. Accordingly, the first positioning pins 81 are inserted into the first positioning holes 22 when the first back panel unit 70 is inserted into the rack 10, enabling the first back panel unit 70 to be positioned relative to the rack 10. This enables the ease of an operation to mount the first back panel unit 70 to the rack 10 to be improved.

Similarly, the second positioning pins 101 are provided to the second positioning panel 92. In addition, the second positioning holes 26, into which the second positioning pins 101 are inserted, are formed in the second fixing portion 25 of the rack 10. Accordingly, the second positioning pins 101 are inserted into the second positioning holes 26 when the second back panel unit 90 is inserted into the rack 10, enabling the second back panel unit 90 to be positioned relative to the rack 10. This enables the ease of an operation to mount the second back panel unit 90 to the rack 10 to be improved.

Explanation follows regarding modified examples of the present exemplary embodiment.

(1) As illustrated in FIG. 1, etc., although the cable units 50 are applied to a server apparatus S, the cable units 50 may be applied to electronic apparatuses other than the server apparatus S.

(2) As illustrated in FIG. 5 and FIG. 6, the upper wall and the pair of side-walls of the second peripheral side-walls 57 formed to the second casing body 53 are disposed at the outside of the upper wall and the pair of side-walls of the first peripheral side-walls 55 formed to the first casing body 52. However, the upper wall and the pair of side-walls of the second peripheral side-walls 57 formed to the second casing body 53 may be disposed at the inside of the upper wall and the pair of side-walls of the first peripheral side-walls 55 formed to the first casing body 52.

In addition, although the lower wall of the second peripheral side-walls 57 is disposed at the lower side the lower wall of the first peripheral side-walls 55, the lower wall of the second peripheral side-walls 57 may be disposed at the upper side of the lower wall of the first peripheral side-walls 55.

In addition, in cases in which the leading end side of the second peripheral side-walls 57 overlaps with the leading end side of the first peripheral side-walls 55, the leading end side of the second peripheral side-walls 57 may be to the inside or to the outside of the leading end side of the first peripheral side-walls 55.

(3) Although the first casing body 52 and the second casing body 53 illustrated in FIG. 7, etc., preferably each have electromagnetic shielding properties, configuration may be such that the first casing body 52 and the second casing body 53 do not have electromagnetic shielding properties. In cases in which the first casing body 52 and the second casing body 53 do not have electromagnetic shielding properties, the cables 63 may be a shielded cables having electromagnetic shielding properties.

(4) As illustrated in FIG. 13, the first guide pins 66 are provided to the positioning pieces 65 and the first guide holes 33 are formed in the rim of the opening 31 of the housing section 30. However, the first guide pins 66 may be provided to the rim of the opening 31 and the first guide holes 33 may be formed in the positioning pieces 65.

Similarly, although the second guide pins 68 are provided to the second main wall 56 and the second guide holes 34 are formed in the end wall 32, the second guide pins 68 may be provided to the end wall 32 and the second guide holes 34 may be formed in the second main wall 56.

(5) As illustrated in FIG. 15, the first positioning pins 81 are provided to the first positioning panel 72 and the first positioning holes 22 are formed in the first fixing portion 21. However, the first positioning pins 81 may be provided to the first fixing portion 21 and the first positioning holes 22 may be formed in the first positioning panel 72.

Similarly, although the second positioning pins 101 are provided to the second positioning panel 92 and the second positioning holes 26 are formed in the second fixing portion 25, the second positioning pins 101 may be provided to the second fixing portion 25 and the second positioning holes 26 may be formed in the second positioning panel 92.

(6) As in the following first to third modified examples, the cable unit 50 illustrated in FIG. 5, etc., may include sliding mechanisms 120 that support the second casing body 53 so as to be slidable relative to the first casing body 52 along the direction in which the first main wall 54 and the second main wall 56 face each other.

Figure 16:
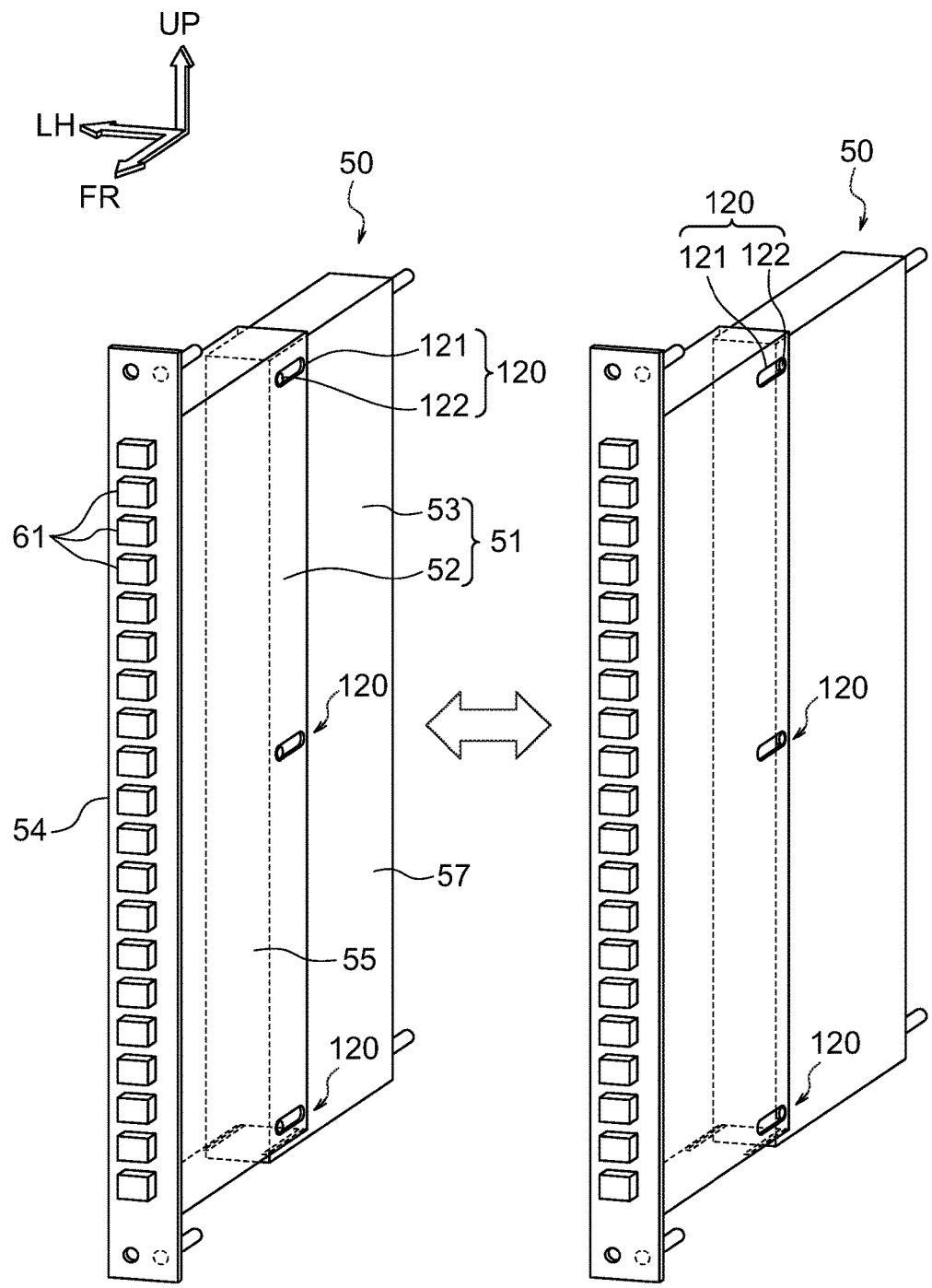
FIG. 16 is a diagram illustrating a first modified example of a cable unit according to an exemplary embodiment.

In the first modified example illustrated in FIG. 16, each sliding mechanism 120 includes an elongated hole 121 formed in a side-wall portion of the first peripheral side-walls 55 and a protrusion 122 formed in a side-wall portion of the second peripheral side-walls 57. Each elongated hole 121 is formed with its length direction in the front-rear direction of the cable unit 50, and the respective protrusion 122 is inserted into the elongated hole 121 so as to be capable of sliding. Although the sliding mechanisms 120 are preferably provided at both left-right direction sides of the cable unit 50, the sliding mechanisms 120 may be provided to only one left-right direction side of the cable unit 50. Further, the protrusions 122 may be formed to the side-wall portion of the first peripheral side-walls 55, and the elongated holes 121 may be formed in the side-wall portion of the second peripheral side-walls 57.

Figure 17:
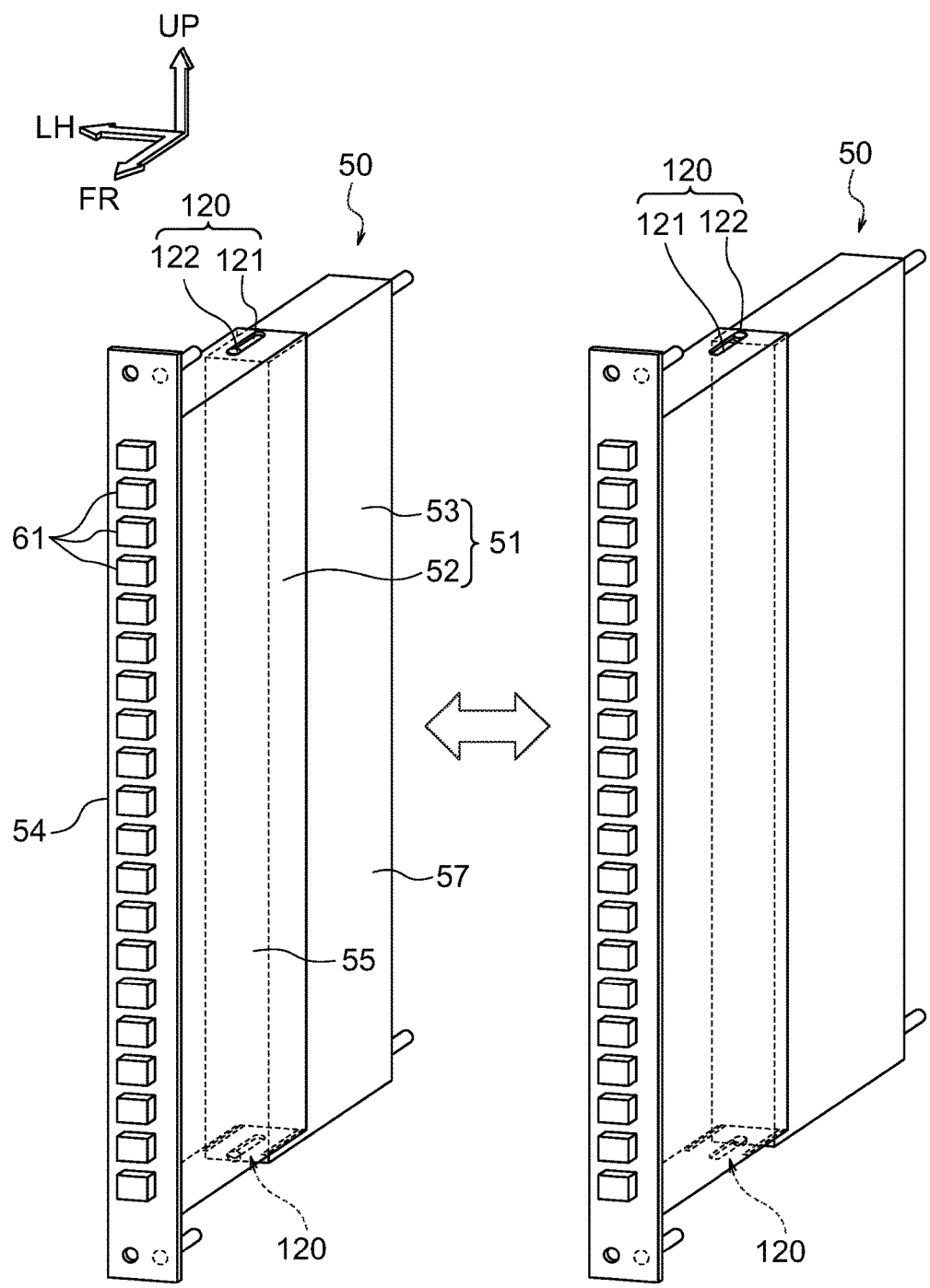
FIG. 17 is a diagram illustrating a second modified example of a cable unit according to an exemplary embodiment.

In the second modified example illustrated in FIG. 17, the elongated holes 121 of the sliding mechanisms 120 described above are formed in upper and lower wall portions of the first peripheral side-walls 55, and the protrusions 122 of the sliding mechanisms 120 described above are formed to upper and lower wall portions of the second peripheral side-walls 57. In the second modified example, although the sliding mechanisms 120 are preferably provided at both up-down direction sides of the cable unit 50, the sliding mechanisms 120 may be provided to only one up-down direction side of the cable unit 50. Further, the protrusions 122 may be formed to the upper wall portion of the first peripheral side-walls 55, and the elongated holes 121 may be formed in the upper wall portion of the second peripheral side-walls 57.

Figure 18:
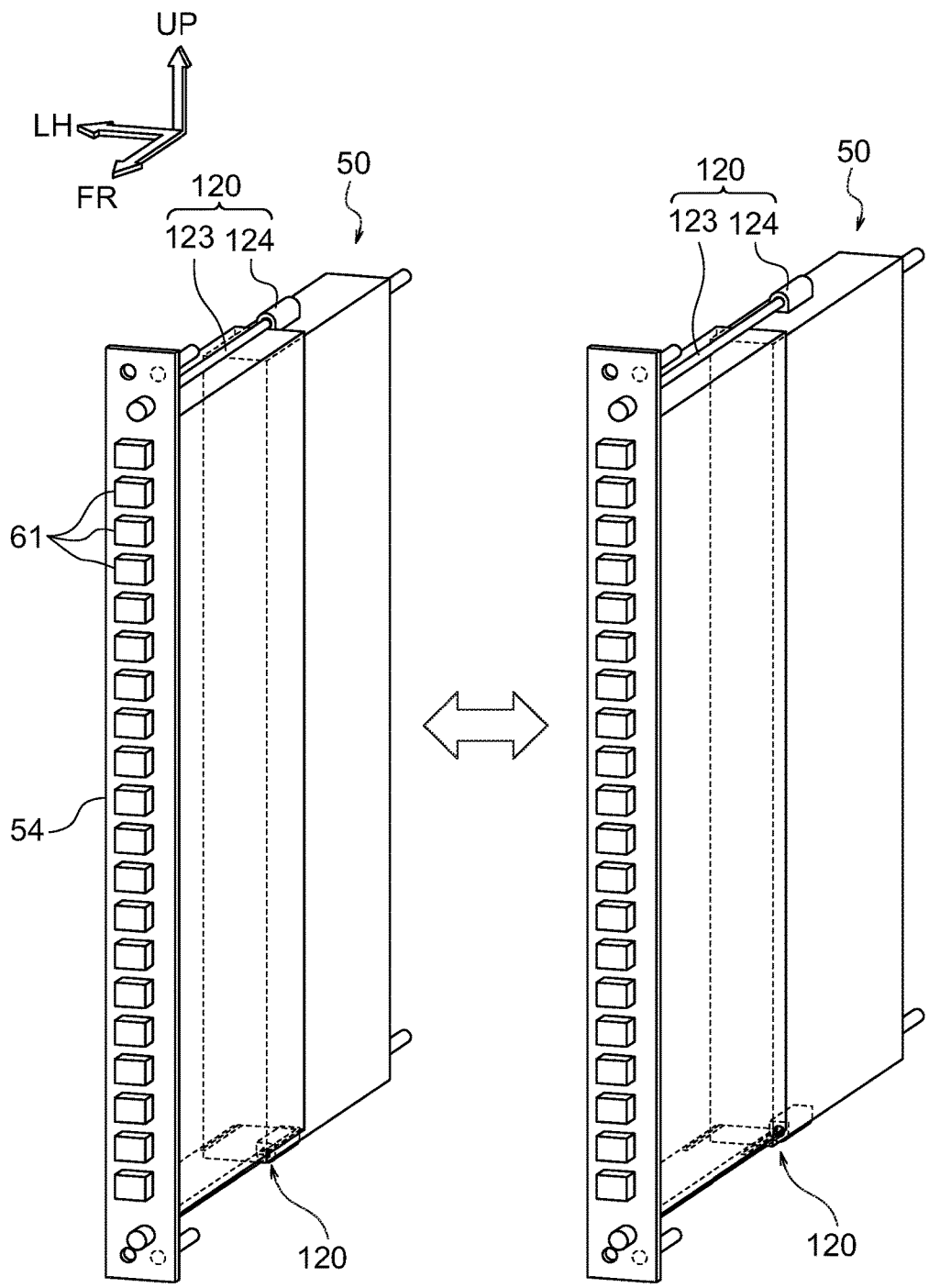
FIG. 18 is a diagram illustrating a third modified example of a cable unit according to an exemplary embodiment.

In the third modified example illustrated in FIG. 18, sliding mechanisms 120 are provided to both up-down direction sides of the cable unit 50. Each sliding mechanism 120 includes a guide pin 123 that is provided to the first peripheral side-walls 55 and a guide portion 124 that is provided to the second peripheral side-walls 57. The guide portion 124 is formed in a tube shape. The guide pin 123 and the guide portion 124 are formed with their axial directions in the front-rear direction of the cable unit 50, and the guide pin 123 is inserted inside the guide portion 124 so as to be capable of sliding. Although the sliding mechanisms 120 are preferably provided at both up-down direction sides of the cable unit 50, the sliding mechanisms 120 may be provided to only one up-down direction side of the cable unit 50. Further, the guide pins 123 may be provided to the second peripheral side-walls 57, and the guide portions 124 may be provided to the first peripheral side-walls 55.

Providing the cable unit 50 with sliding mechanisms 120 in this manner suppresses wobble of the first casing body 52 and the second casing body 53, and enables one of the first casing body 52 or the second casing body 53 to smoothly slide relative to the other. This enables the ease of operations to be improved when the first main wall 54 and the second main wall 56 of the cable unit 50 are screwed to the housing section 30 as illustrated in FIG. 14, for example.

Explanation has been given regarding an exemplary embodiment of technology disclosed by the present specification. However, the technology disclosed by the present specification is not limited to the above, and obviously various other modifications may be implemented within a range not departing from the spirit thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cable unit comprising:
a first casing body forming an open shape that includes a first main wall and a first peripheral side-wall formed at a peripheral edge of the first main wall;
a second casing body forming an open shape that includes a second main wall and a second peripheral side-wall formed at a peripheral edge of the second main wall, the second casing body being fitted together with the first casing body at respective open portion sides of the second casing body and the first casing body such that the second casing body and the first casing body configure a box-shaped casing that expands and contracts along a direction in which the first main wall and the second main wall face each other;
a first connector that is provided to the first main wall;
a second connector that is provided to the second main wall; and
a cable that is housed in the casing, and that connects the first connector with the second connector,
wherein the casing expands and contracts due to bending and stretching of the cable.

2. The cable unit of claim 1, wherein the second casing body is fitted to the first casing body in a state in which a leading end side of the second peripheral side-wall overlaps a leading end side of the first peripheral side-wall.

3. The cable unit of claim 1, wherein the first casing body and the second casing body each have electromagnetic shielding properties.

4. The cable unit of claim 1, wherein the cable is a non-shielded cable.

5. The cable unit of claim 1, further comprising a sliding mechanism that supports the second casing body so as to be slidable relative to the first casing body along the direction in which the first main wall and the second main wall face each other.

6. A server apparatus comprising:
a rack;
a first electronic unit mounted at a front-face side of the rack;
a second electronic unit mounted at a back-face side of the rack; and
a cable unit that is disposed between the first electronic unit and the second electronic unit and that connects the first electronic unit with the second electronic unit;
the cable unit including
a first casing body including a first main wall facing a back face of the first electronic unit and a first peripheral side-wall formed at a peripheral edge of the first main wall, the first casing body forming an open shape that is open toward the back-face side of the rack,
a second casing body including a second main wall facing a back face of the second electronic unit and a second peripheral side-wall formed at a peripheral edge of the second main wall, the second casing body forming an open shape that is open toward the front-face side of the rack, and the second casing body being fitted together with the first casing body at respective open portion sides of the second casing body and the first casing body such that the second casing body and the first casing body configure a box-shaped casing that expands and contracts along a direction in which the first main wall and the second main wall face each other,
a first connector that is provided to the first main wall and that is connected to a back-face connector of the first electronic unit,
a second connector that is provided to the second main wall and that is connected to a back-face connector of the second electronic unit, and
a cable that is housed in the casing and that connects the first connector with the second connector,
wherein the casing expands and contracts due to bending and stretching of the cable.

7. A server apparatus comprising:
a rack;
a first electronic unit mounted at a front-face side of the rack;

a second electronic unit mounted at a back-face side of the rack; and
a cable unit that is disposed between the first electronic unit and the second electronic unit and that connects the first electronic unit with the second electronic unit;
the cable unit including
a first casing body including a first main wall facing a back face of the first electronic unit and a first peripheral side-wall formed at a peripheral edge of the first main wall, the first casing body forming an open shape that is open toward the back-face side of the rack,
a second casing body including a second main wall facing a back face of the second electronic unit and a second peripheral side-wall formed at a peripheral edge of the second main wall, the second casing body forming an open shape that is open toward the front-face side of the rack, and the second casing body being fitted together with the first casing body at respective open portion sides of the second casing body and the first casing body such that the second casing body and the first casing body configure a box-shaped casing that expands and contracts along a direction in which the first main wall and the second main wall face each other,
a first connector that is provided to the first main wall and that is connected to a back-face connector of the first electronic unit,
a second connector that is provided to the second main wall and that is connected to a back-face connector of the second electronic unit, and
a cable that is housed in the casing and that connects the first connector with the second connector, wherein
the rack is provided with a housing section having an opening at the front-face side of the rack and having an end wall at the back-face side of the rack;
the cable unit is housed in the housing section;
the first main wall includes a positioning piece that is abutted against a rim of the opening from the front-face side of the rack;
the second main wall is abutted against the end wall from the front-face side of the rack;
the first connector projects out toward the front-face side of the rack relative to the first main wall; and
the second connector passes through the end wall so as to project out toward the back-face side of the rack relative to the end wall.

8. The server apparatus of claim 7, wherein:
a first guide pin is provided to one of the positioning piece or the rim of the opening;
a first guide hole, into which the first guide pin is inserted, is formed in the other out the positioning piece or the rim of the opening;
a second guide pin is provided to one of the second main wall or the end wall; and
a second guide hole, into which the second guide pin is inserted, is formed in the other of the second main wall or the end wall.

9. The server apparatus of claim 7, wherein:
a first back panel is disposed at a side of the first main wall, and a third connector is mounted to the first back panel so as to face the front-face side of the rack;
a first positioning panel which extends toward the first main wall side and abuts the first main wall from the front-face side of the rack is provided to a mounting face for the third connector on the first back panel;
a second back panel is disposed at a side of the second main wall, and a fourth connector is mounted to the second back panel so as to face the back-face side of the rack; and
a second positioning panel which extends toward the end wall side and abuts the end wall from the back-face side of the rack is provided to a mounting face for the fourth connector on the second back panel.

10. The server apparatus of claim 9, wherein:
a front face of the first main wall is disposed in the same plane as the mounting face for the third connector on the first back panel in a state in which the first positioning panel abuts the first main wall from the front-face side of the rack; and
a back face of the end wall is disposed in the same plane as the mounting face for the fourth connector on the second back panel in a state in which the second positioning panel abuts the end wall from the back-face side of the rack.

11. The server apparatus of claim 9, wherein:
the rack is provided with:
a first fixing portion that is disposed at a side of the first back panel at the back-face side of the rack, with the first back panel being fixed to the first fixing portion, and
a second fixing portion that is disposed at a side of the second back panel at the front-face side of the rack, with the second back panel being fixed to the second fixing portion;
a first positioning pin is provided to one of the first positioning panel or the first fixing portion;
a first positioning hole, into which the first positioning pin is inserted, is formed in the other of the first positioning panel or the first fixing portion;
a second positioning pin is provided to one of the second positioning panel or the second fixing portion; and
a second positioning hole, into which the second positioning pin is inserted, is formed in the other of the second positioning panel or the second fixing portion.

* * * * *